United States Patent
Nakase et al.

(10) Patent No.: US 6,760,269 B2
(45) Date of Patent: Jul. 6, 2004

(54) SEMICONDUCTOR MEMORY DEVICE CAPABLE OF GENERATING INTERNAL DATA READ TIMING PRECISELY

(75) Inventors: Yasunobu Nakase, Hyogo (JP); Koji Nii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/445,009

(22) Filed: May 27, 2003

(65) Prior Publication Data

US 2003/0231527 A1 Dec. 18, 2003

(30) Foreign Application Priority Data

Jun. 17, 2002 (JP) ........................................ 2002-175852

(51) Int. Cl.[7] ............................................... G11C 7/00
(52) U.S. Cl. ...................... 365/210; 365/196; 365/206; 365/207
(58) Field of Search ............................. 365/196, 210, 365/206, 207

(56) References Cited

U.S. PATENT DOCUMENTS 5,742,552 A * 4/1998 Greenberg .................. 365/210
6,229,746 B1 * 5/2001 Tooher ........................ 365/210
6,490,214 B2 * 12/2002 Kawasumi ................... 365/210
6,556,472 B2 * 4/2003 Yokozeki ..................... 365/154

FOREIGN PATENT DOCUMENTS

| JP | 61-264590 | 11/1986 |
|----|-----------|---------|
| JP | 3-122898 | 5/1991 |
| JP | 9-259589 | 10/1997 |

OTHER PUBLICATIONS

Osada, et al. "Universal–Vdd 0.65–2.0V 32kB Cache Using Voltage–Adapted Timing–Generation Scheme and a Lithographic–Symmetric Cell" 2001 ISSCC (Feb. 6, 2001) pp. 168–169.

U.S. patent application Ser. No. 10/339,324, Watanabe et al.
U.S. patent application Ser. No. 10/329,355, Nii et al.

* cited by examiner

Primary Examiner—Son T. Dinh
(74) Attorney, Agent, or Firm—McDermott, Will & Emery

(57) ABSTRACT

Dummy cells are divided into a plurality of divided dummy columns, and divided dummy bit lines are arranged corresponding to the divided dummy columns. These divided dummy bit lines are provided with dummy sense amplifiers that drive a sense control line transmitting a sense enable signal activating a sense amplifier. A faster activation timing of the sense amplifier can be achieved.

20 Claims, 23 Drawing Sheets

US 6,760,269 B2

SEMICONDUCTOR MEMORY DEVICE CAPABLE OF GENERATING INTERNAL DATA READ TIMING PRECISELY

BACKGROUND OF THE INVENTION

1. Field of the Invention

The present invention relates to a semiconductor memory device and more specifically to a configuration for speeding up a sense amplifier for reading selected memory cell data. More particularly, the present invention relates to a configuration for a high-speed data reading in a static semiconductor memory device.

2. Description of the Background Art

Semiconductor memory devices (simply referred to as a memory hereinafter) include a static memory (SRAM: Static Random Access Memory) having an internal circuit operating statically, a dynamic memory (DRAM: Dynamic Random Access Memory) having an internal circuit operating dynamically and having stored data required to refresh, and a non-volatile memory storing data in a non-volatile manner. These memories are used in various fields depending on their individual characteristics.

FIG. 26 schematically shows a configuration of a main part of a conventional SRAM. In FIG. 26, the conventional semiconductor memory includes normal memory cells M arranged in rows and columns. FIG. 26 representatively shows memory cells M00 to M0n to Mm0 to Mmn arranged in a matrix of (m+1) rows and (n+1) columns.

Word lines W0 to Wm are disposed corresponding to the respective rows of normal memory cells M00 to Mmn. FIG. 26 representatively shows a word line W0 arranged corresponding to normal memory cells Mm0 to Mmn, a word line Wk arranged corresponding to normal memory cells Mk0 to Mkn, and a word line Wm arranged corresponding to normal memory cells Mm0 to Mmn.

A pair of normal bit lines BT and BB are disposed corresponding to each column of normal memory cells M00 to Mmn. FIG. 26 representatively shows normal bit lines BT0 and BB0 arranged corresponding to normal memory cells M00 to Mm0, and normal bit lines BTn and BBn arranged corresponding to normal memory cells M0n to Mmn. Complementary data are transmitted through paired normal bit line BT (generically representing normal bit lines BT0 to BTn) and normal bit line BB (generically representing normal bit lines BB0 to BBn) when a normal memory cell on a corresponding column is selected.

The respective pairs of normal bit lines BT0 and BB0 to BTn and BBn are provided with bit line precharge circuits PNC0 to PNCn each responsive to a precharge signal PRC for precharging normal bit lines BT and BB in a corresponding pair to a prescribed potential (power supply voltage VDD) level. Each of these bit line precharge circuits PNC0 to PNCn includes a precharge transistor configured of a P channel MOS transistor (an insulated gate type field effect transistor) transmitting power supply voltage VDD to corresponding bit lines BT and BB when conductive, and an equalize transistor configured of a P channel MOS transistor rendered conductive in response to precharge signal PRC and electrically short-circuiting corresponding bit lines BT and BB when made conductive.

Word line drive circuits WD0 to WDm are provided corresponding to word lines W0 to Wm, respectively. These word line drive circuits WD0 to WDm drive corresponding word lines W0 to Wm to a selected state in accordance with row select signals X0 to Xm generated by decoding a row address signal (not shown). Each of these word line drive circuits WD0 to WDm in FIG. 26 is configured with cascaded inverters of two stages, by way of example.

One of these row select signals X0 to Xm is driven to H (logic high) level, and a word line corresponding to that row select signal is driven to H level. In other words, a selected word line has a voltage level at H level, and a non-selected word line has a voltage level at L (logic low) level. Therefore, in the state in which a word line is selected, the voltage level of the word line corresponding to the row that is addressed in accordance with a row address signal (not shown) is driven and held at H level, and the voltage level of the remaining word lines (non-selected word lines) is held at L level.

Column select gates PCS0 to PCSn selectively rendered conductive in response to column select signals Y0 to Yn are provided corresponding to the respective pairs of normal bit lines BT0, BB0 to BTn, BBn. Each of these column select gates PCS0 to PCSn includes P channel MOS transistors provided for the respective bit lines BT and BB. By rendering column select gates PCS0 to PCSn conductive in accordance with column select signals Y0 to Yn, a normal bit line pair arranged corresponding to a column designated by the column select signals is coupled to a sense amplifier SA.

H level data can be transmitted to the sense amplifier without a threshold voltage loss in the MOS transistor by configuring a column select gate PCS (generically representing column select gates PCS0 to PCSn) with P channel MOS transistors.

This sense amplifier SA is activated in response to activation of a sense enable signal SE and differentially amplifies the bit line potential transmitted through the selected column select gate to generate internal read data Dout.

A dummy column DSET is provided in order to generate sense enable signal SE to the sense amplifier SA. In dummy column DSET, dummy memory cells D0 to Dm are disposed sharing the rows with normal memory cells M00 to Mmn, respectively. These dummy cells D0 to Dm are respectively connected to word lines W0 to Wm arranged in corresponding rows.

Dummy bit lines DT and DB are disposed corresponding to dummy memory cells D0 to Dm. These dummy bit lines DT and DB are provided with a dummy bit line precharge circuit PDC responsive to precharge signal PRC for precharging and equalizing dummy bit lines DT and DB to a prescribed voltage (power supply voltage VDD) level. Similarly to precharge circuits PNC0 to PNCn, this dummy bit line precharge circuit PDC includes a P channel MOS transistor for equalization and P channel MOS transistors for precharging.

In dummy column DSET, an inverter buffer G190 for generating sense enable signal SE is provided for dummy bit line DT. More specifically, the internal connection of dummy memory cells D0 to Dm is set such that L level data is read onto dummy bit line DT.

The memory cells as many as those for each pair of normal bit lines BT0, BB0 to BTn, BBn are connected to dummy bit lines DT and DB. Dummy cells D0 to Dm and normal memory cells M00 to Mmn have component transistors of the same size, and the same loads are connected to dummy bit line DT and normal bit lines BB and BT. Therefore a timing at which memory cell data is read on normal bit lines BT0, BB0 to BTn, BBn can be detected by detecting the potential decrease in this dummy bit line DT. Responsively, when memory cell data is read and the potential difference between a pair of normal bit lines exceeds a prescribed value, sense enable signal SE is activated to cause sense amplifier SA to carry out a sensing operation.

FIG. 27 shows the circuit configuration of normal memory cells M00 to Mmn shown in FIG. 26. These normal memory cells M00 to Mmn have the same configuration, and therefore, FIG. 27 representatively shows a normal memory cell M.

In FIG. 27, normal memory cell M includes a P channel MOS transistor PQ1 connected between a power supply node and a storage node ML and having its gate connected to a storage node MR, a P channel MOS transistor PQ2 connected between the power supply node and storage node MR and having its gate connected to storage node ML, an N channel MOS transistor NQ1 connected between storage node ML and a ground node and having its gate connected to storage node MR, an N channel MOS transistor NQ2 connected between storage node MR and the ground node and having its gate connected to storage node ML, an N channel MOS transistor NQ3 responsive to a signal on word line W for electrically coupling storage node ML to normal bit line BT selectively, and an N channel MOS transistor NQ4 selectively rendered conductive in response to a signal on word line W and electrically coupling storage node MR to normal bit line BB when made conductive.

MOS transistors PQ1 and NQ1 form a first CMOS inverter, and MOS transistors PQ2 and NQ2 form a second CMOS inverter. These first and second CMOS inverters form an inverter latch holding data at storage nodes MR and ML.

In the configuration of normal memory cell M shown in FIG. 27, complementary data are held at storage nodes ML and MR by the first and second CMOS inverters. Specifically, one of storage nodes ML and MR is at power supply voltage VDD level and the other is at the ground voltage level.

When word line W is driven to a selected state, MOS transistors NQ3 and NQ4 are rendered conductive, and storage nodes ML and MR are electrically coupled to normal bit lines BT and BB. These normal bit lines BT and BB are precharged at power supply voltage VDD level in advance by bit line precharge circuit PNC. Therefore, out of these normal bit lines BT and BB, the potential of the normal bit line coupled to a storage node storing L level data is lowered, and the other bit line is held at power supply voltage VDD level. Sense amplifier SA senses and amplifies the potential difference between these normal bit lines BT and BB.

FIG. 28 shows the circuit configuration of dummy cells D0 to Dm shown in FIG. 26. These dummy cells D0 to Dm have the same configuration, and therefore, FIG. 28 representatively shows the circuit configuration of a single dummy cell D.

In FIG. 28, dummy cell D includes a P channel MOS transistor PQ3 connected between the power supply node and a storage node DSL and having its gate connected to the power supply node, an N channel MOS transistor NQ5 connected between storage node DSL and the ground node and having its gate connected to the power supply node, a P channel MOS transistor PQ4 connected between the power supply node and a storage node DSR and having its gate connected to the ground node, an N channel MOS transistor NQ6 connected between storage node DSR and the ground node and having its gate connected to the ground node, an N channel MOS transistor NQ7 selectively rendered conductive in response to a signal on word line W and electrically coupling storage node DSL to dummy bit line DT when made conductive, and an N channel MOS transistor NQ8 selectively rendered conductive in response to a signal on word line W and electrically coupling storage node DSR to dummy bit line DB when conductive.

In the configuration of dummy cell D shown in FIG. 28, MOS transistors PQ3 and NQ6 are fixed at an off-state or non-conductive state, and MOS transistors PQ4 and NQ5 are fixed at an on-state or conductive state. Therefore, storage node DSL is fixed at L level and storage node DSR is fixed at H level.

When word line W is selected and has its voltage level rising, MOS transistors NQ7 and NQ8 are rendered conductive, and storage nodes DSL and DSR are electrically coupled to dummy bit lines DT and DB, respectively. Since storage node DSL is at L level, the current flows from dummy bit line DT precharged to the power supply voltage level by dummy precharge circuit PDC through MOS transistors NQ7 and NQ5 to the ground node, and the potential level of this dummy bit line DT is lowered. On the other hand, dummy bit line DB is held at the power supply voltage level since storage node DSR is at the power supply voltage VDD level and there is no discharging path. When the potential of this dummy bit line DT exceeds an input logical threshold of inverter buffer G190 shown in FIG. 26, sense enable signal SE from this inverter buffer G190 is activated.

FIG. 29 shows an exemplary configuration of sense amplifier SA shown in FIG. 26. In FIG. 29, sense amplifier SA includes a P channel MOS transistor PS2 connected between the power supply node and an internal node SL and having its gate connected to internal node SR, a P channel MOS transistor PS3 connected between the power supply node and internal node SR and having its gate connected to internal node SL, an N channel MOS transistor NS0 receiving sense enable signal SE at its gate, an N channel MOS transistor NS1 connected between internal node SL and MOS transistor NS0 and having its gate connected to internal node SR, an N channel MOS transistor NS2 connected between internal node SR and MOS transistor NS0 and having its gate connected to internal node SL, a P channel MOS transistor PS0 transferring (coupling) an input signal (node) /NB to internal node SL in accordance with sense enable signal SE, and a P channel MOS transistor PS1 transferring (coupling) an input signal (node) /NT to internal node SR in response to sense enable signal SE. Internal read data Dout is output from internal node SR.

Input signals /NB and /NT are signals corresponding to the potential levels on normal bit lines BB and BT, respectively, when a column is selected. Where reference characters /NT and /NB indicate input nodes, these nodes /NT and /NB are internal read data lines to which selected bit lines are coupled through a column select gate. In the following description, reference characters /NT and /NB will be used to indicate input signals to sense amplifier SA.

In this sense amplifier SA, when sense enable signal SE is at L level, MOS transistors PS0 and PS1 are turned on, and input signals /NB and /NT are transmitted to internal nodes SL and SR. In this state, MOS transistor NS0 is turned off, a path through which operating current flows is shut off in the circuit configured of MOS transistors PS2, PS3, NS1 and NS2, and the sensing operation is not carried out.

When sense enable signal SE goes to H level, MOS transistors PS0 and PS1 are turned off, and internal nodes SL and SR are isolated from the signal input nodes (internal data lines). In this state, MOS transistor NS0 is turned on, sense amplifier SA is activated, and one of internal nodes SL and SR is driven to the ground voltage level while the other is driven to the power supply voltage VDD level.

In sense amplifier SA shown in FIG. 29, after the input signals, that is, bit line voltages /NB and /NT are confined in internal nodes SL and SR, sense amplifier SA is activated to carry out the sensing operation. P channel MOS transistors PS2 and PS3 have their gates and drains cross-coupled, and N channel MOS transistors NS1 and NS2 have their gates and drains cross-coupled. Cross-coupled MOS transistors PS2 and PS3 hold a higher potential internal node of internal nodes SL and SR at the power supply voltage VDD level, and cross-coupled MOS transistors NS1 and NS2 drive the lower potential internal node of internal nodes SL and SR to the ground voltage level.

Internal nodes SL and SR are usually driven to the power supply voltage VDD level by a data line precharge circuit (not shown) when sense enable signal SE is at L level. This sense amplifier SA has the voltage level at internal node SL or SR lowered in accordance with the transmitted bit line potential, and differentially amplifies that potential difference between the internal nodes for latching.

This sense amplifier SA shown in FIG. 29 is called a latch type sense amplifier as it latches the amplified data at internal nodes SL and SR while being activated. The following advantages are provided by using this latch type sense amplifier in place of a general, current mirror type sense amplifier. As semiconductor integrated circuits is increased in integration degree with finer process techniques, reduced power consumption is strongly demanded in view of prevention of malfunctions due to heat generation and others. Memory such as SRAM is not exceptional in this regard. When a current mirror type sense amplifier is used, a current source is required and constantly current flows in holding data, increasing undesirable current consumption. On the other hand, in the case of a latch type sense amplifier, current only temporarily flows at the time of a sensing operation in which the voltages at internal nodes SL and SR are differentially amplified, and current does not flow after these internal nodes SL and SR are driven to the power supply voltage VDD and ground voltage levels. Therefore, power consumption can be reduced significantly as compared with the current mirror type sense amplifier.

By isolating these internal nodes SL and SR from the signal input nodes at the time of the sensing operation, this sense amplifier SA is required only to drive internal nodes SL and SR and thus can drive a small load at high speed and carry out the sensing operation at high speed with low power consumption.

FIG. 30 is a signal waveform diagram representing the operation of SRAM shown in FIGS. 26 to 29 in reading data. In the following, referring to FIG. 30, the operation of memory (SRAM) shown in FIGS. 26 to 29 will be described.

It is assumed that precharge signal PRC is a signal generated in synchronization with a clock signal (not shown) and this SRAM is a clock synchronous type memory. It is further assumed that data is read out while this clock signal is being at H level and the bit line is precharged while the clock signal is being at L level.

While the clock signal is at L level, precharge signal PRC is also at L level, all precharge circuits PDC and PNC0 to PNCn are activated, and all dummy bit lines DT and DB and normal bit lines BT0, BB to BTn, BBn are precharged to the power supply voltage VDD level, for initialization of the reading operation.

When precharge signal PRC rises to H level, all precharge circuits PDC and PNC0 to PNCn are inactivated, and all dummy bit lines DT and DB and normal bit lines BT0, BB0 to BTn, BBn enter a floating state at the power supply voltage VDD level. Furthermore, in response to the rising of the clock signal, a row select signal is generated in accordance with an externally applied address signal, one of row select signals X0 to Xm shown in FIG. 26 is driven to H level, and a corresponding word line is responsively driven to a selected state. As shown in FIG. 30, assuming that word line Wk is selected, the voltage level of this selected word line Wk goes to H level.

In parallel with this row select operation, a column select operation is carried out such that one of column select signals Y0 to Yn is driven to a selected state in accordance with a column address signal (not shown), a corresponding column select gate of column select gates PCS0 to PCSn attains an on to state, and a normal bit line corresponding to the selected column is coupled to sense amplifier SA. The selection of column and row causes a single normal memory cell M to be selected. Now, consider a case where normal memory cell Mk0 is selected. It is further assumed that in this selected normal memory cell Mk0, storage nodes ML and MR shown in FIG. 27 store data at H level and L level, respectively. In this case, the voltage level on normal bit line BT0 to which storage node ML is connected is unchanged at H level of the precharge level, while the potential on normal bit line BB0 to which storage node MR is connected is gradually lowered since the potential on normal bit line BB0 is discharged through transistors NQ4 and NQ2 of the selected normal memory cell Mk0.

On the other hand, in dummy column DSET, dummy cells D0 to Dm configured with transistors having the same size as those of the normal memory cell are connected to dummy bit lines DT and DB. The number of dummy cells D0 to Dm connected to dummy bit lines DT and DB is equal to the number of normal memory cells connected to normal bit lines BT and BB. Therefore, in dummy column DSET, the potential of dummy bit line DT is lowered due to discharging through MOS transistors NQ7 and NQ5 shown in FIG. 28. The rate at which the potential of this dummy bit line DT is lowered is equal to the rate at which the potential of the normal bit line is lowered, as the normal bit line in the selected column has the same load as dummy bit line DT.

Here, it is assumed that the input logical threshold of inverter buffer G190 provided in this dummy column DSET is set at VDD/2. At the time t0 shown in FIG. 30, when the potential of dummy bit line DT reaches VDD/2, sense enable signal SE from inverter buffer G190 is driven to H level and sense amplifier SA is activated.

When sense enable signal SE is at L level, the potential difference between the selected normal bit lines BT0 and BB0 is transmitted to the internal node of sense amplifier SA, so that a sufficiently large potential difference is formed also in internal nodes SL and SR of sense amplifier SA. When sense enable signal SE goes to H level, sense amplifier SA is activated and carries out the sensing operation while confining the charges in internal nodes SL and SR.

When the clock signal falls to L level and precharge signal PRC goes to L level, the row select operation is completed, the selected word line Wk is driven to a non-selected state, and the voltage levels on bit lines BT0 and BB0 and dummy bit lines DT and DB are driven to H level again by precharge circuits PDC and PNC0 to PNCn. When the potential level of dummy bit line DT rises, sense enable signal SE from inverter buffer G190 goes to L level, thereby completing the sensing operation. In FIG. 30, sense enable signal SE is shown being inactivated after both dummy bit lines DT and DB are precharged to H level. This is to increase the duration of the activation period of sense enable signal SE to ensure the sufficient latching period of sense amplifier SA for reliably reading out internal data. This setting of activation duration period of sense enable signal SE is achieved by applying sense enable signal SE to sense amplifier SA through a falling delay circuit (not shown).

The following advantages can be provided by activating sense enable signal SE using dummy column DSET described above.

Specifically, latch type sense amplifier SA has a characteristic of a large gain, in addition to its advantage that DC current does not flow after the data amplifying operation. Sense amplifier SA is able to sense even slighter potential difference between the bit lines, as its gain is larger. In the latch type sense amplifier SA, however, once erroneous data is sensed and amplified, that sensed/amplified data can not be corrected.

Therefore, when the sensing operation is started before the potential difference between the bit lines becomes large enough, data may not be sensed correctly due to variations in characteristics of the transistors forming this sense amplifier SA and noises superimposed on the bit line. In order to prevent such erroneous reading, the sensing operation is started by detecting a time point at which the bit line potential, that is, the potential difference between sense amplifier internal nodes SL and SR becomes large enough using dummy column DSET.

More specifically, dummy cell D (D0 to Dm) has a component transistor having the same size as the transistors of normal memory cell M. Furthermore, the parasitic capacitance of dummy bit line DT is also the same as that of normal bit lines BT and BB. Therefore, the potential changing rate in dummy bit line DT is the same as the potential changing rate in normal bit line BT or BB. Furthermore, dummy cell D and normal memory cell M are also the same in delay time required to select a word line, since they share a word line. Therefore, when sense amplifier SA starts the sensing operation, the potential difference is VDD/2also in the normal bit line pair as similar to dummy bit lines DT and DB, and this potential difference is transmitted to sense amplifier SA. It is therefore ensured that at the time of the sensing operation by sense amplifier SA, the potential difference between the bit lines can be set large enough and a sufficient sense margin is secured, so that erroneous reading can be prevented.

Since latch type sense amplifier SA is great in gain, erroneous reading may not occur as far as the potential difference between the bit lines is on the order of 100 mV, even in consideration of the effects of variations in transistor characteristics and noises. However, as shown in FIG. 31, where power supply voltage VDD is 1.8V, sense enable signal SE is activated at the time point t0 at which the potential difference between bit line pair is 0.9V. Sense amplifier SA can carry out the sensing operation at the time ta to generate the internal read data, since the sensing operation is carried out accurately as far as the potential difference AVs between the bit line pair is 100 mV.

Therefore in the conventional configuration, the internal read data can not be generated at high speed because an excessively large sense margin is set. In other words, the internal reading operation is delayed by the time period from the time ta to the time to shown in FIG. 31.

In order to set this internal reading timing faster, it can be considered to set the input logical threshold of inverter buffer G190 shown in FIG. 26 at a higher voltage. The input logical threshold of the inverter buffer is adjusted by adjusting the sizes and threshold voltages of the transistors as its component. Therefore, variations in transistor characteristics cause variations in the input logical threshold, resulting in that it becomes impossible to activate the sense enable signal accurately in accordance with the potential difference between the dummy bit line pair, or the normal bit line pair while ensuring the sensing margin.

SUMMARY OF THE INVENTION

An object of the present invention is to provide a semiconductor memory device in which a sensing operation starting timing can be set faster accurately in accordance with a potential on a dummy bit line.

Another object of the present invention is to provide a semiconductor memory device in which a potential difference between bit line pair at the start of a sensing operation can be set at a required minimum potential difference.

A further object of the present invention is to provide a semiconductor memory device in which data can be read out at high speed and accurately.

A semiconductor memory device in accordance with the present invention includes: a plurality of normal cells arranged in rows and columns; a plurality of dummy cells arranged sharing rows with these plurality of normal cells and divided into a plurality of blocks in a column extending direction; a plurality of normal bit lines arranged corresponding to columns of the normal cells, each having a normal cell on a corresponding column connected; a plurality of divided dummy bit lines arranged corresponding to respective blocks in the column of dummy cells, each having dummy cells in a corresponding block connected; a sense amplifier sensing and amplifying data in a selected cell of the normal cells; and a sense control circuit responsive to a potential change in any one of the plurality of divided dummy bit lines for activating the sense amplifier.

The dummy cells are arranged sharing rows with the normal memory cells, and the dummy bit line arranged corresponding to these dummy cells is divided in the column extending direction. By detecting the potential change in these divided dummy bit lines to activate the sense amplifier, it is possible to make the load on the divided dummy bit line smaller than the load on the normal bit line. It is possible to make a potential changing rate in this divided dummy bit line greater than a potential changing rate in the normal bit line and to thus activate the sense amplifier at a faster timing. Therefore, a sensing operation can start when a potential difference between the normal bit lines is small, and the sensing operation can be carried out with a required minimum sense margin, thereby allowing a high-speed and accurate reading operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
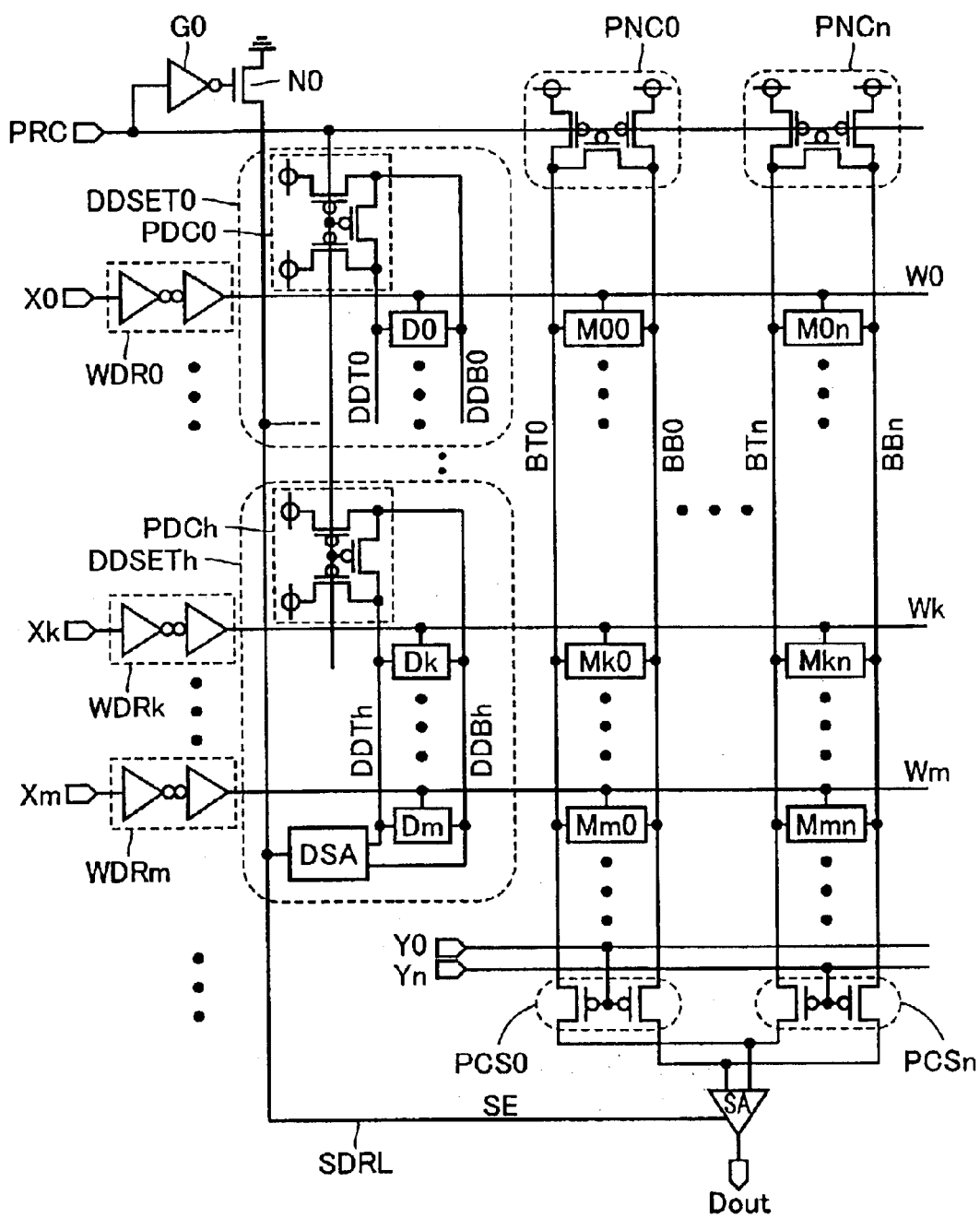
FIG. 1 is a diagram showing a configuration of a main part of an SRAM in accordance with a first embodiment of the present invention.

FIG. 1 is a diagram showing a configuration of a main part of an SRAM in accordance with a first embodiment of the present invention. In FIG. 1, similarly to the conventional example, normal memory cells M00 to Mmn are arranged in a matrix of (m+1) rows and (n+1) columns. Corresponding to the respective columns of these normal memory cells M00 to Mmn, normal bit line pairs BT0, BB0 to BTn, BBn are arranged. Corresponding to the respective normal bit line pairs BT0, BB0 to BTn, BBn, bit line precharge circuits PNC0 to PNCn responsive to a precharge signal PRC are arranged. Each of these precharge circuits PNC0 to PNCn includes a P channel MOS transistor for equalization and a P channel MOS transistor for precharging.

Furthermore, corresponding to the respective normal bit line pairs BT0, BB0 to BTn, BBn, column select gates PCS0 to PCSn rendered conductive in response to column select signals Y0 to Yn are provided. These column select gates PCS0 to PCSn electrically couple the respective corresponding bit line pairs BT0, BB0 to BTn, BBn to a sense amplifier SA when made conductive.

Corresponding to the respective rows of normal memory cells M00 to Mmn, word lines W0 to Wm are arranged. Word line drive circuits WDR0 to WDRm are provided for the respective word lines W0 to Wm. These word line drive circuits WDR0 to WDRm drive the corresponding word lines to a selected state in accordance with row select signals X0 to Xm generated by decoding a row address signal (not shown).

Figure 27:
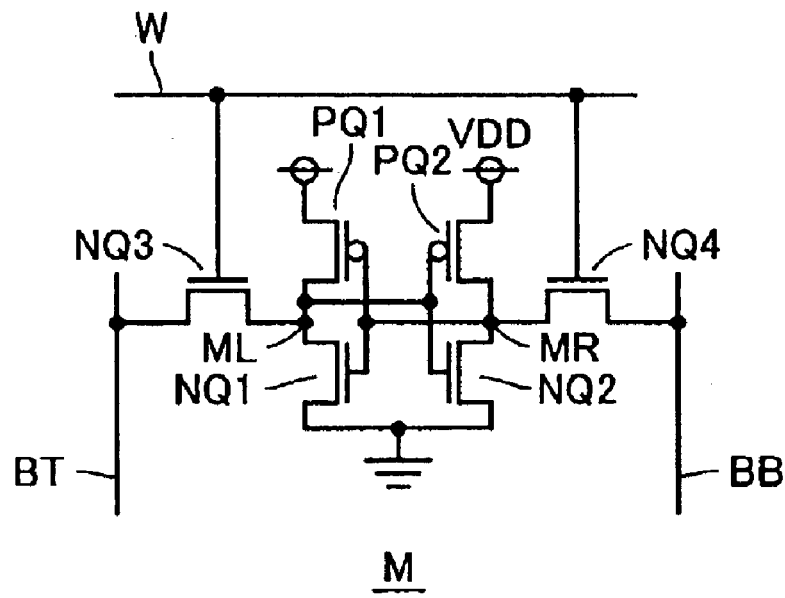
FIG. 27 is a diagram showing a configuration of a normal memory cell shown in FIG. 26.
Figure 28:
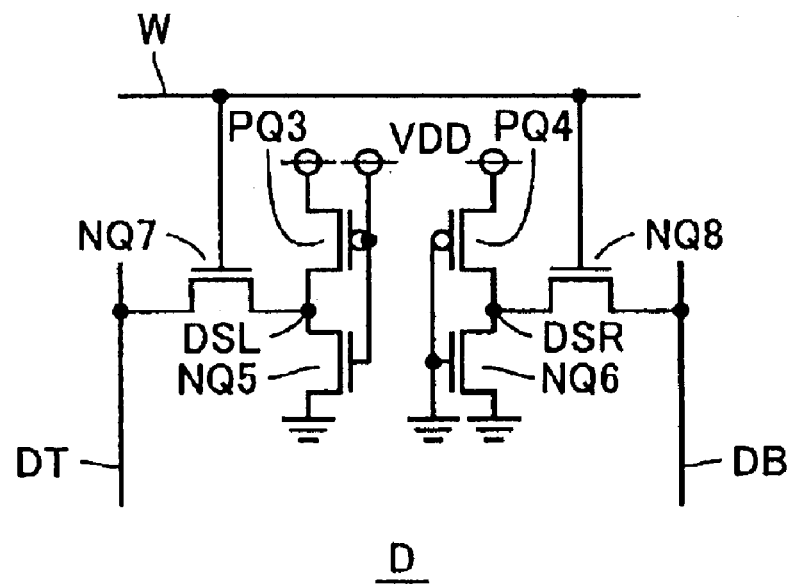
FIG. 28 is a diagram showing a configuration of a dummy cell shown in FIG. 26.
Figure 29:
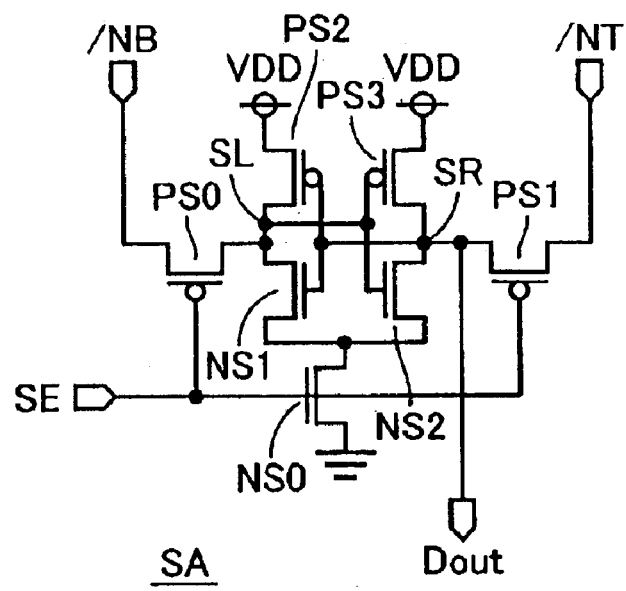
FIG. 29 is a diagram showing a configuration of a sense amplifier shown in FIG. 26.
Figure 30:
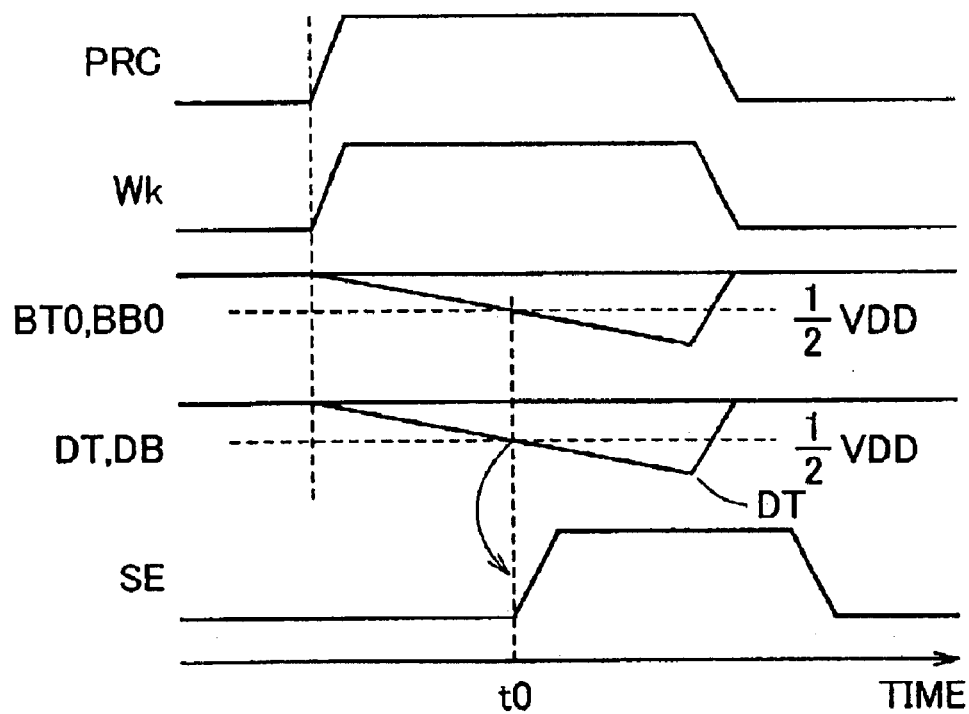
FIG. 30 is a signal waveform diagram representing an operation of SRAM shown in FIG. 26.

Each of normal memory cells M00 to Mmn has the same configuration as the normal memory cell M shown in FIG. 27.

Dummy cells D0 to Dm are arranged sharing the rows with these normal memory cells M00 to Mmn. Each of these dummy cells D0 to Dm has, unlike the conventional example, the same configuration as normal memory cell M shown in FIG. 27. These dummy cells D0 to Dm are divided into a plurality of divided dummy columns DDSET0 to DDSETh. In FIG. 1, dummy cells D0 to Dm are divided into p (=h+1) blocks.

In the respective divided dummy columns DDSET0 to DDSETh, divided dummy bit lines DDT and DDB are arranged to the corresponding dummy cells. FIG. 1 representatively shows divided dummy bit lines DDT0 and DDB0 arranged corresponding to dummy cell D0 . . . in divided dummy column DDSET0, and divided dummy bit lines DDTh and DDBh arranged corresponding to dummy cells Dk to Dm in divided dummy column DDSETh.

Each of divided dummy columns DDSET0 to DDSETh is provided with a precharge circuit for dummy bit line PDC (PCD0 to PDCh) precharging and equalizing the corresponding divided dummy bit lines DDT and DDB to a power supply voltage VDD level in accordance with precharge signal PRC, and a dummy sense amplifier DSA sensing a potential difference between the corresponding divided dummy bit lines DDT and DDB to drive a sense control line SDRL in accordance with this sensing result. A sense enable signal SE is generated on this sense control line SDRL to be provided to sense amplifier SA.

Similar to a precharge circuit for normal bit line PNC (generically representing precharge circuits PNC0 to PNCn), precharge circuit for dummy bit line PDC (generically representing precharge circuits PCD0 to PDCh) is configured with a P channel MOS transistor for equalization and P channel MOS transistors for precharging.

FIG. 1 representatively shows dummy precharge circuits PCD0 and PDCh arranged for divided dummy columns DDSET0 and DDSETh, and dummy sense amplifier DSA provided in dummy column DDSETh.

In order to set dummy control line SDRL at an initial state, there are provided an inverter G0 inverting precharge signal PRC, and an N channel MOS transistor N0 driving dummy control line SDRL to a ground voltage level in accordance with an output signal from this inverter G0.

Dummy cells D0 to Dm are the same in circuit connection and configuration as normal memory cells M00 to Mmn. Precharge circuit PDC for each divided dummy bit line also has the same configuration as precharge circuit PNC for the normal bit line. Therefore, the load on each of divided dummy bit lines DDT0, DDB0 to DDTh, DDBh is sufficiently smaller than that on each of normal bit lines BT0, BB0 to BTn, BBn. In other words, when the dummy cells included in these divided dummy columns DDSET0 to DDSETh are equal in number, the load on divided dummy bit lines DDT, DDB is 1/(h+1) times that on normal bit lines BT and BB. Thus, the divided dummy bit line can be discharged faster than the normal bit line by a selected dummy cell.

Figure 2:
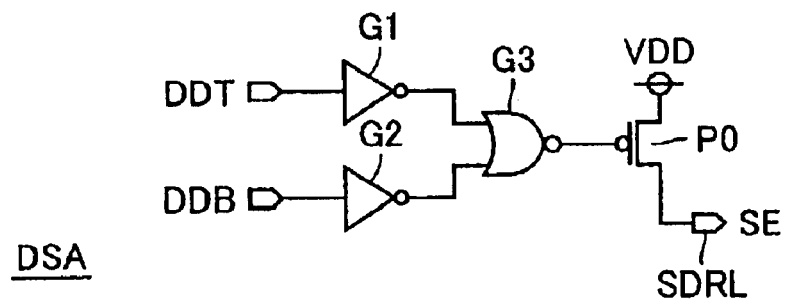
FIG. 2 is a diagram showing a configuration of a dummy sense amplifier shown in FIG. 1.

FIG. 2 is a diagram showing an exemplary configuration of dummy sense amplifier DSA shown in FIG. 1. In FIG. 2, dummy sense amplifier DSA includes an inverter G1 inverting a voltage signal on a corresponding divided dummy bit line DDT, an inverter G2 receiving a voltage signal on a corresponding divided dummy bit line DDB, an NOR gate G3 receiving output signals from inverters G1 and G2, and a P channel MOS transistor P0 selectively rendered conductive in accordance with an output signal from NOR gate G3 and coupling sense control line SDRL to a power supply node when conductive.

When a potential of one of divided dummy bit lines DDT and DDB is lowered beyond an input logical threshold of inverters G1 and G2 from H level of precharge voltage level, the output signals of inverters G1 and G2 turn H level. The output signal of NOR gate G3 responsively turns L level, P channel MOS transistor P0 is rendered conductive, and sense enable signal SE on sense control line SDRL is driven to H level. In other words, the potential change on divided dummy bit lines DDT and DDB is detected using inverters G1 and G2, and sense enable signal SE is activated using P channel MOS transistor P0 in accordance with the result of detection of this potential change.

Figure 3:
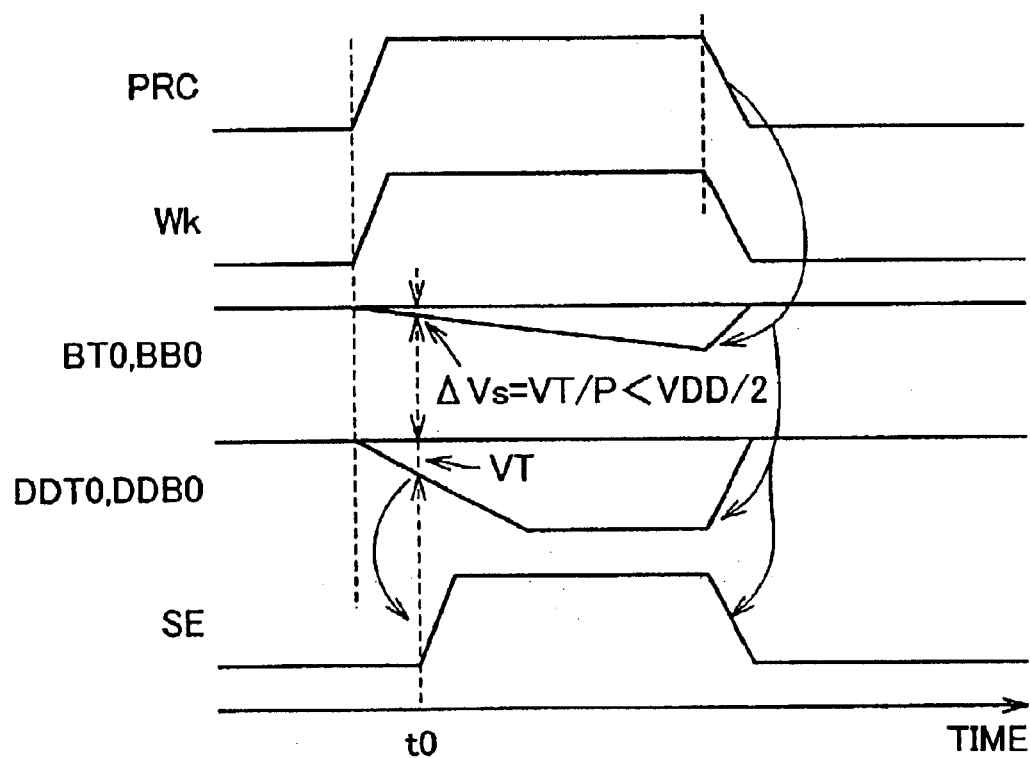
FIG. 3 is a signal waveform diagram representing the operation of SRAM shown in FIG. 1.

FIG. 3 is a signal waveform diagram representing a reading operation of SRAM shown in FIGS. 1 and 2. In the following, the date reading operation in SRAM shown in FIGS. 1 and 2 will be described with reference to the signal waveform diagram shown in FIG. 3.

Similarly to the conventional, it is assumed that a reading operation is carried out while a clock signal is at H level, and the bit lines (normal bit lines and dummy bit lines) are precharged while this clock signal is at L level. It is also assumed that precharge signal PRC changes in synchronization with the clock signal.

While the clock signal is at L level, precharge signal PRC is also at L level, all precharge circuits PCD0 to PDCh and PNC0 to PNCn are activated, and all divided dummy bit lines DDT0, DDB0 to DDTh, DDBh and normal bit lines BT0, BB0 to BTn, BBn are precharged and equalized to the power supply voltage VDD level. Furthermore, the output signal of inverter G0 is at H level, and sense control line SDRL is held at a ground voltage level by MOS transistor N0.

During L level period of the clock signal, an initialization is performed for the reading operation.

When precharge signal PRC rises to H level, precharge circuits PCD0 to PDCh and PNC0 to PNCn are inactivated, and the precharge operation is stopped on divided dummy bit lines DDT0, DDB0 to DDTh, DDBh and normal bit lines BT0, BB0 to BTn, BBn. Furthermore, in synchronization with the clock signal, a row select operation is carried out in accordance with an applied address signal, and one of row select signals X0 to Xn is driven to H level. Now, it is assumed that word line Wk is selected. This selected word line Wk is driven to H level by word line drive circuit WDRk. Furthermore, column select signal Y0 is driven to the selected state through a column select operation carried out in parallel with this row select operation. Now, consider a case where column select signal Y0 is driven to the selected state and normal bit lines BT0 and BB0 are coupled to sense amplifier SA.

In accordance with selection of word line Wk, accessing MOS transistors are rendered conductive in memory cell Mk0, and a potential difference occurs between normal bit lines BT0 and BB0, depending on the stored data in this normal memory cell Mk0. Now, it is assumed that in normal memory cell Mk0, H level data and L level data are held at storage nodes ML and MR shown in FIG. 27, respectively. In this state, normal bit line BT0 connected to storage node ML has the potential thereon unchanged at H level of precharge level, while normal bit line BB0 connected to storage node MR has the potential thereon gradually lowered due to sinking of the current flow by this normal memory cell Mk0.

As described above, the dummy column is divided into p (=h+1) rows. Therefore, in divided dummy columns DDSET0 to DDSETh, connected dummy cells D are 1/p as many as the normal memory cells connected to the normal bit lines, and the dummy cell D has the transistors of the same size as the normal memory cell.

When precharge signal PRC rises to H level, word line Wk is selected substantially at the same time and dummy cell Dk is selected. This dummy cell Dk has the same circuit configuration and connection as the normal memory cell. Now, assuming that H level data and L level data are respectively held at storage nodes ML and MR (see FIG. 27) in this dummy cell Dk. In divided dummy column DDSETh, the potential of divided dummy bit line DDTh connected to storage node ML in this dummy cell Dk ahs the potential thereof unchanged at H level of precharge level, while the potential of divided dummy bit line DDBh connected to storage node MR ahs the potential gradually lowered because of the discharging by this dummy cell Dk.

Divided dummy bit lines DDTh and DDBh are respectively connected to inverters G1 and G2 in dummy sense amplifier DSA shown in FIG. 2. Therefore, when the potential of divided dummy bit line DDBh is lowered beyond input logical threshold VT of inverter G2, the output signal of inverter G2 goes to H level, responsively, the output of NOR gate G3 goes to L level, MOS transistor P0 is turned on, and sense enable signal SE is driven to H level.

In the other divided dummy columns, since the corresponding word lines are in non-selected state, the potential of all the divided dummy bit lines is at H level of precharge level, and P channel MOS transistor P0 at the output stage of a corresponding dummy sense amplifier DSA is kept off. In other words, only the divided dummy column including a selected dummy cell can activate sense enable signal SE. The dummy cells included in the divided dummy column are 1/p as many as the normal memory cells connected to the normal bit lines, and the dummy bit line is also 1/p as long as the normal bit line. Therefore, the potential changing rate of dummy bit lines DDT and DDB is p times greater than that of normal bit lines BT and BB.

Dummy cell D and normal memory cell M have the same delay time required till selection of a word line, since they share the word line. The input logical threshold of inverters G1 and G2 at the input stage of dummy sense amplifier DSA is VT. At the time t0 when sense enable signal SE is driven to H level, the potential difference between the dummy bit line pair is threshold voltage VT while the potential difference between normal bit line pair BT and BB0 is VT/p. With power supply voltage VDD being 1.8V, input logical threshold VT is VDD/2 and the number, p, by which dummy column is divided is 4, sense amplifier SA is activated when the potential difference between normal bit line pair BT and BB is 225 mV. Therefore, the potential difference between the bit line pair in activating the sense amplifier is significantly decreased from the potential difference 0.9V in the conventional. As a result, it is possible to reduce an unnecessary waiting time in activating sense amplifier SA, to increase the speed of reading operation in SRAM.

Assuming that this dummy column-dividing number p is 8 and dummy cells D0 to Dm are divided into eight blocks, sense amplifier SA is activated when the potential difference between the normal bit line pair is 112.5 mV, thereby achieving even faster reading operation.

In the foregoing description, it is assumed that the number of dummy cells D included in each of divided dummy columns DDSET0 to DDSETh is equal and the number of rows (m+1) of the memory cell array is an integer multiple of the dummy column-dividing number p. However, even if the number of divided blocks of the dummy column is not an integer multiple of the number of rows of the memory cell array, the similar effect can result. In a case where the number of rows (m+1) of the memory cell array is 66 and the number of divided blocks of the dummy column is 4, for example, the dummy column is divided such that sixteen dummy cells are arranged in each of first and second divided dummy columns and seventeen dummy cells are arranged in each of third and fourth divided dummy columns. In this case, the load capacitance of the divided dummy bit lines in the third and fourth dummy columns is larger than that of the divided dummy bit lines in the first and second dummy columns by 1/16=6.25%, and therefore the potential difference between the normal bit line pair in operating sense amplifier SA is also larger by 14 mV. This potential difference, however, can be neglected enough as compared with the other factors of the potential difference between the bit lines, such as variations in the transistor characteristics, thereby achieving an accurate sensing operation. This dummy column block-dividing number needs only be determined appropriately depending on the sensitivity (a potential difference discriminating capability) of sense amplifier SA.

As described above, in accordance with the first embodiment of the present invention, the dummy bit line is divided into a plurality of divided dummy bit lines, and the timing for activating the sense amplifier is set in accordance with the potential change in the plurality of divided dummy bit lines. As a result, the potential difference between the bit line pair in activating the sense amplifier can be set at an optimum value, and an unnecessarily large potential difference may not be provided for the sense amplifier. Accordingly, an unnecessary waiting time in activating the sense amplifier can be reduced and the reading operation of SRAM can be speeded up.

[Second Embodiment]

Figure 4:
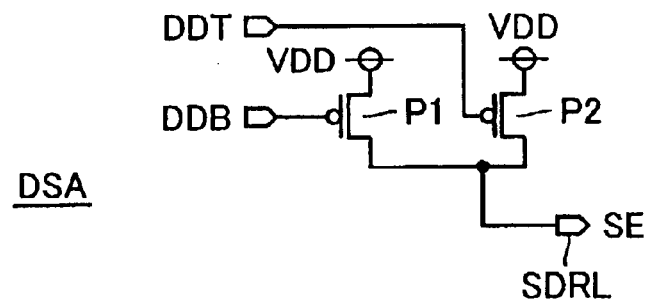
FIG. 4 is a diagram showing the configuration of the dummy sense amplifier in accordance with a second embodiment of the present invention.

FIG. 4 is a diagram showing the configuration of the dummy sense amplifier in accordance with a second embodiment of the present invention. In FIG. 4, dummy sense amplifier DSA includes a P channel MOS transistor P1 driving sense control line SDRL in accordance with a voltage on divided dummy bit line DDB (any of DDB0 to DDBh), and a P channel MOS transistor P2 driving sense control line SDRL in accordance with a voltage on divided dummy bit line DDT (any of DDT0 to DDTh). This dummy sense amplifier DSA shown in FIG. 4 is arranged for each divided dummy column DDSET (DDSET0 to DDSETh).

Figure 5:
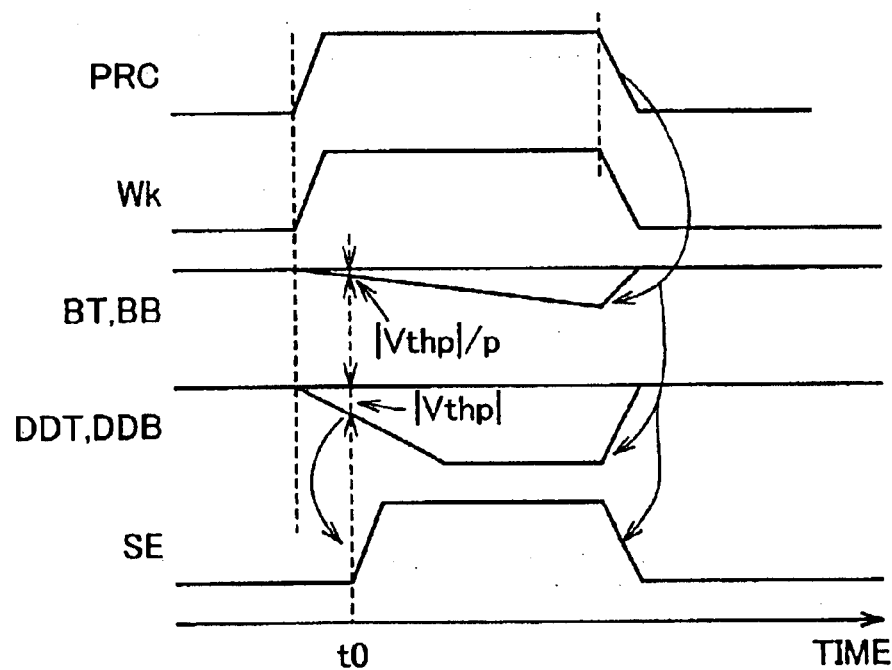
FIG. 5 is a signal waveform diagram illustrating the operation of SRAM using the dummy sense amplifier shown in FIG. 4.

FIG. 5 is a signal waveform diagram representing an operation of the dummy sense amplifier shown in FIG. 4. In the following, referring to FIG. 5, the operation of dummy sense amplifier DSA shown in FIG. 4 will be described.

Now, it is assumed that MOS transistors P1 and P2 each have a threshold voltage Vthp. It is also assumed that precharge signal PRC changes in synchronization with and in common phase with a clock signal (not shown), and data is read out while this clock signal CLK is at H level.

While precharge signal PRC is at L level, as shown in FIG. 1, divided dummy bit lines DDT and DDB are precharged to the power supply voltage VDD level by a corresponding precharge circuit PDC (PDC0 to PDCn). Therefore, MOS transistors P1 and P2 are kept off. Sense control line SDRL is maintained at the ground voltage level by MOS transistor N0 shown in FIG. 1.

When the reading operation is started, precharge signal PRC rises to H level and a word line and a normal bit line are selected in accordance with an address signal. In response to selection of word line, the potential of one of divided dummy bit lines DDT and DDB is lowered in accordance with the stored data in the selected dummy cell. The threshold voltage of MOS transistors P1 and P2 is Vthp. Therefore, as the voltage level of divided dummy bit lines DDT and DDB is decreased from power supply voltage VDD by an absolute value |Vthp| of the threshold voltage, one of MOS transistors P1 and P2 is turned on, sense control line SDRL is charged by the MOS transistor in the on-state, and sense enable signal SE is driven to H level.

Since only MOS transistors P1 and P2 are arranged as components in dummy sense amplifier DSA shown in FIG. 4, the circuit configuration can be simplified as compared with dummy sense amplifier DSA shown in FIG. 2, so that the similar function to that of the dummy sense amplifier shown in FIG. 2 can be implemented with a significantly reduced circuit layout area.

The potential difference ΔVs between the normal bit line pair at the time of activation of sense enable signal SE is given by voltage |Vthp|/p, where p is the number of divided dummy columns and the loads on the divided dummy bit lines in the divided dummy columns are equal to each other. Assuming that threshold voltage Vthp is −0.4V and the number of divided blocks of dummy columns is 4, ΔVs= 0.1V. Therefore, by making use of the threshold voltages of MOS transistors P1 and P2, the sensing operation can be started at a faster timing since the absolute value |Vthp| of these threshold voltages is sufficiently smaller than input logical threshold (VDD/2) of inverters G1 and G2 shown in FIG. 2. Therefore, the reading operation can further be speeded up without changing the dummy column-dividing number p.

In other words, when the dummy column-dividing number is increased for speeding up the reading operation, more precharge circuits for dummy bit line PDC and dummy sense amplifiers DSA are required, and the area occupied by the dummy column is increased accordingly. However, by utilizing dummy sense amplifier DSA shown in FIG. 4, a timing for activating the sense amplifier can be advanced even with the same dummy column-dividing number. Therefore, the reading operation can be speeded up without increasing the layout area for the dummy column.

[Third Embodiment]

Figure 6:
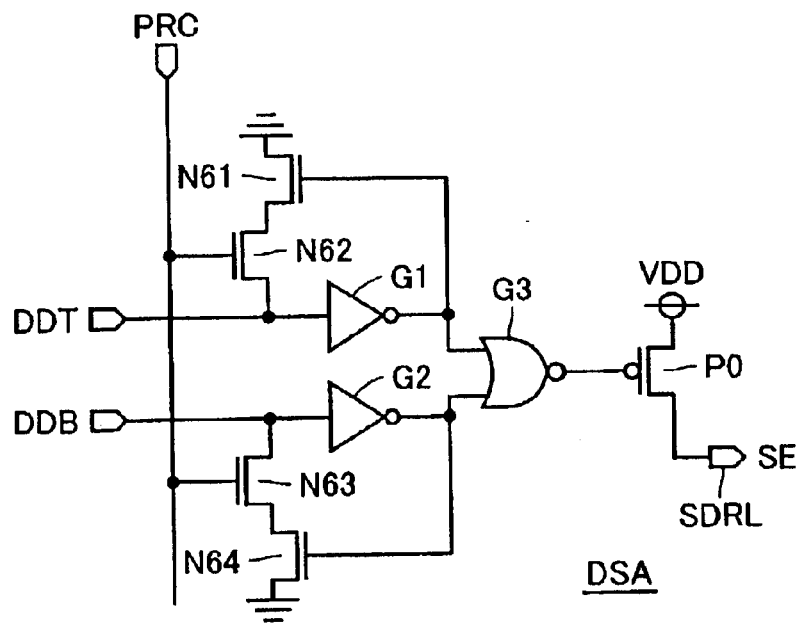
FIG. 6 is a diagram showing the configuration of the dummy sense amplifier in accordance with a third embodiment of the present invention.

FIG. 6 is a diagram showing the configuration of dummy sense amplifier DSA in accordance with a third embodiment of the present invention. The dummy sense amplifier shown in FIG. 6 is arranged for each divided dummy column. This dummy sense amplifier DSA shown in FIG. 6 is different in configuration from the dummy sense amplifier shown in FIG. 2 in the following points. N channel MOS transistors N62 and N61 are connected in series between divided dummy bit line DDT and the ground node, and N channel MOS transistors N63 and N64 are connected in series between divided dummy bit line DDB and the ground node. MOS transistors N62 and N63 receive precharge signal PRC at their gates. MOS transistor N61 receives the output signal of inverter G1 at its gate, and MOS transistor N64 receives the output signal of inverter G2 at its gate. The other configuration of this dummy sense amplifier DSA shown in FIG. 6 is the same as dummy sense amplifier DSA shown in FIG. 2. The corresponding parts will be denoted with the same reference numerals and description thereof will not be repeated.

In the configuration of dummy sense amplifier DSA shown in FIG. 6, for the time duration of precharging, MOS transistors N62 and N63 are kept off, and divided dummy bit lines DDT and DDB are isolated from the ground node and precharged to the power supply voltage VDD level by the corresponding precharge circuit.

Upon completion of precharging and starting of the reading operation, precharge signal PRC goes to H level, and MOS transistors N62 and N63 are turned on. When the potential of one of divided dummy bit lines DDT and DDB is lowered in accordance with the stored data in the dummy cell, the output signal from corresponding one of inverters G1 and G2 goes to H level, MOS transistors N61 and N64 are turned on responsively. Divided dummy bit line DDT or DDB having the potential thereof lowered is discharged to the ground potential level, this potential lowering of the divided dummy bit line is accelerated, responsively, the corresponding output signal from inverter G1 or G2 rise rapidly, and the potential lowering of this divided dummy bit line is accelerated.

Figure 7:
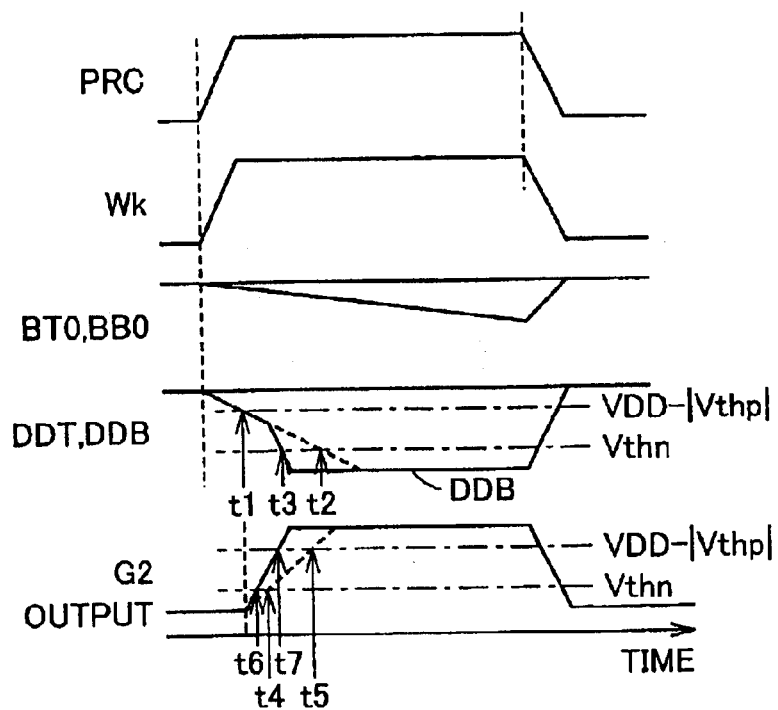
FIG. 7 is a signal waveform diagram representing the operation of the dummy sense amplifier shown in FIG. 6.

FIG. 7 is a signal waveform diagram representing the operation of the dummy sense amplifier shown in FIG. 6. In the following, referring to FIG. 7, the operation of dummy sense amplifier DSA shown in FIG. 6 will be described in detail. Inverters G1 and G2 are configured using CMOS transistors.

Upon completion of precharging and starting of the reading operation, precharge signal PRC rises to H level, and MOS transistors N62 and N63 are turned on. Word line Wk is selected and normal bit lines BT0 and BB0 are selected to be coupled to sense amplifier SA (not shown).

In this case, upon selection of word line Wk, a potential change occurs in divided dummy bit line DDT or DDB. Now, it is considered a case where the potential of divided dummy bit line DDB is lowered. When the voltage level of divided dummy bit line DDB is lowered to voltage VDD−|Vthp| at the time t1, in inverter G2, the P channel MOS transistor is turned on and through-current starts flowing. This through-current continues flowing until the N channel MOS transistor in inverter G2 is turned off.

When through-current starts flowing in inverter G2 at the time t1, the output signal from inverter G2 rises. When the output signal from this inverter G2 exceeds threshold voltage Vthn of the N channel MOS transistor at the time t6, MOS transistor N64 is turned on and the current flows from divided dummy bit line DDB to the ground node through MOS transistors N63 and N64, thereby accelerating the potential lowering. Because of the accelerated potential lowering on this dummy bit line DDB, changing of the output signal from inverter G2 is accelerated and the potential lowering on dummy bit line DDB is further accelerated.

When the voltage level of divided dummy bit line DDB reaches the threshold voltage Vthn of the N channel MOS transistor at the time t3, in inverter G2, the N channel MOS transistor is turned off and the through-current is cut off.

In NOR gate G3, the P channel MOS transistor internally provided is turned on and N channel MOS transistor internally provided is turned off when the output signal of inverter G2 is at L level. When the output signal of inverter G2 reaches voltage Vthn at the time t6, the internal N channel MOS transistor starts being conductive, the through-current flows, and the output signal of NOR gate G3 is lowered.

When the output signal of inverter G2 reaches voltage VDD−|Vthp| at the time t7, in NOR gate G3, the P channel MOS transistor is turned off, the through-current is cut off, and the output signal of NOR gate G3 is driven to L level.

Without this MOS transistor N64, the divided dummy bit line would be discharged only by the selected dummy cell, and the changing rate of the signal is relatively moderate as shown in the signal waveform in broken line in FIG. 7. More specifically, when the output signal of inverter G2 reaches voltage Vthn at the time t4, the through-current starts flowing in NOR gate G3 at the next stage. The through-current flows in NOR gate G3 until the output signal of the inverter G2 reaches voltage VDD−|Vthp| at the time t5. Furthermore, when the voltage on divided dummy bit line DDB reaches voltage Vthn through discharging by the dummy memory cell at the time t2, the through-current in inverter G2 is cut off.

By providing N channel MOS transistors N61 and 64 rendered conductive in response to the output signals of these inverters G1 and G2 to accelerate the potential change of the divided bit line, it is possible to shorten the time duration in which the through-current flows in inverters G1 and G2 and the time period during which the through-current flows in NOR gate G3, and thus to reduce the power consumption. In addition, since the output signal of inverter G2 rises at high speed, the output signal of NOR gate G3 rises steeply, P channel MOS transistor P0 is turned on at high speed, and sense enable signal SE is also driven to the active state at a faster timing.

[Modification]

Figure 8:
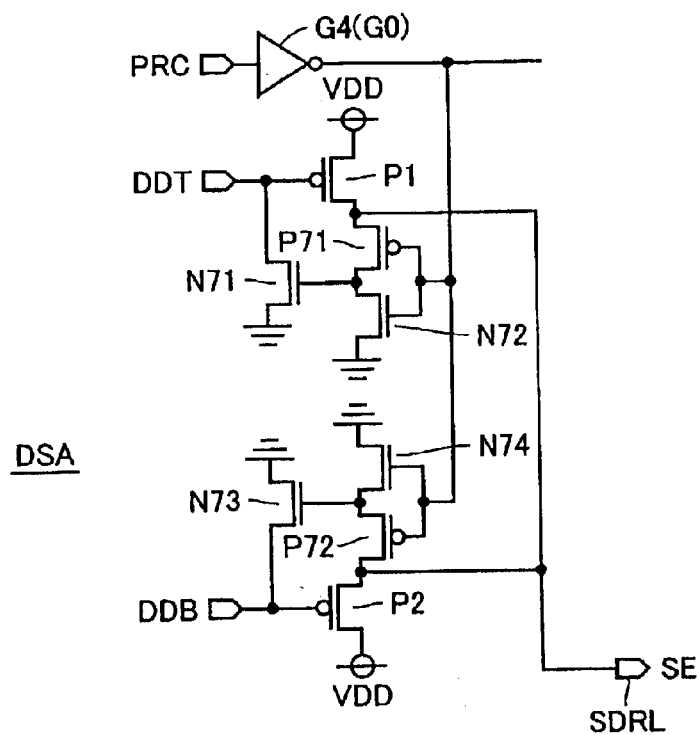
FIG. 8 is a diagram showing the configuration of the dummy sense amplifier in a modification of the third embodiment of the present invention.

FIG. 8 is a diagram showing the configuration of the dummy sense amplifier in a modification of the third embodiment of the present invention. This dummy sense amplifier DSA shown in FIG. 8 is different in configuration from the dummy sense amplifier shown in FIG. 4 in the following points. A P channel MOS transistor P71 and an N channel MOS transistor N72 are connected in series between the ground node and P channel MOS transistor P1 driving sense control line SDRL in accordance with the voltage on divided dummy bit line DDT. An N channel MOS transistor N71 is also connected between divided dummy bit line DDT and the ground node. MOS transistors P71 and P72 receive at their gates the output signal of inverter G4 receiving precharge signal PRC. MOS transistor N71 has its gate connected to the connection node between MOS transistors P71 and N72.

Furthermore, a P channel MOS transistor P72 and an N channel MOS transistor N74 are connected in series between the ground node and P channel MOS transistor P2 driving sense control line SDRL in accordance with the voltage on divided dummy bit line DDB. An N channel MOS transistor N73 is connected between divided dummy bit line DDB and the ground node. MOS transistors P72 and N74 receive at their gates the output signal of inverter G4. MOS transistor N73 has its gate connected to the connection node between MOS transistors P72 and N74. This inverter G4 may be the common inverter as inverter G0 shown in FIG. 1.

Figure 9:
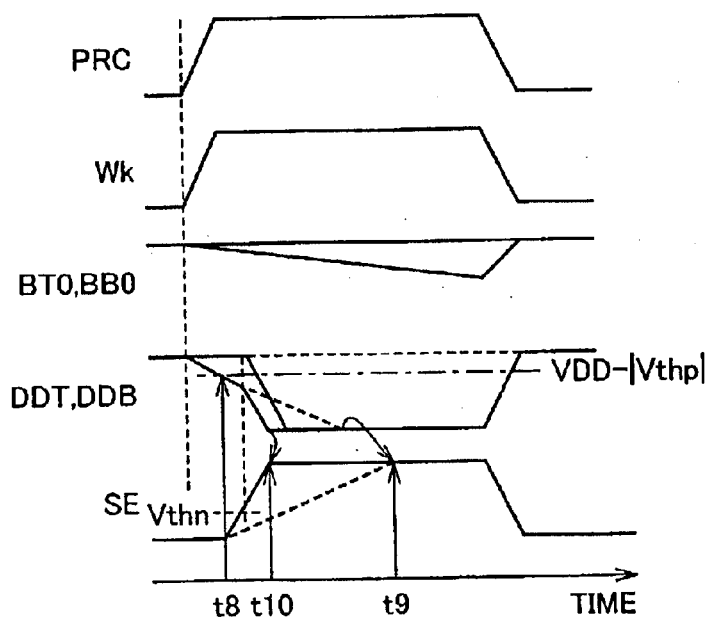
FIG. 9 is a signal waveform diagram representing the operation of the dummy sense amplifier shown in FIG. 8.

FIG. 9 is a signal waveform diagram representing the operation of the dummy sense amplifier shown in FIG. 8. In the following, referring to FIG. 9, the operation of the dummy sense amplifier shown in FIG. 8 will be described.

For the time duration of precharging, precharge signal PRC is at L level and the output signal of inverter G4 is at H level. Therefore, MOS transistors P71 and P72 are in an off-state, MOS transistors N72 and N74 are in an on-state, and MOS transistors N71 and N73 are in an off-state. In this state, divided dummy bit lines DDT and DDB are precharged to the power supply voltage VDD level by the corresponding precharge circuit.

Upon starting of the reading operation, precharge signal PRC rises to H level, and the voltage level of selected word line Wk rises. Responsively, a potential difference occurs between normal bit lines BT0 and BB0 in accordance with the stored data in the selected memory cell.

In accordance with rising of the voltage level of this selected word line Wk, the voltage level of one of divided dummy bit lines DDT and DDB changes. Now, it is considered a state in which the voltage level of divided dummy bit line DDB is lowered. In this state, when the voltage level of divided dummy bit line DDB is lowered to the voltage VDD−|Vthp|, MOS transistor P2 is turned on, and the voltage level of sense enable signal SE rises. Since precharge signal PRC is at H level, the output signal of inverter G4 is at L level, MOS transistors P71 and P72 are in an on-state, and MOS transistors N72 and N74 are in an off-state. Sense enable signal SE is transmitted to the gates of MOS transistors N71 and N73 through MOS transistors P71 and P72, respectively.

When the voltage level of sense enable signal SE exceeds threshold voltage Vthn of MOS transistors N71 and N73, MOS transistor N71 is turned on and MOS transistor N73 is also turned on. As a result, the potential of divided dummy bit line DDB is lowered even faster and the voltage level of divided dummy bit line DDT is also lowered. According to the lowering of potential of divided dummy bit line DDB, MOS transistor P2 raises sense enable signal SE to H level at high speed. In this state, since the voltage level of divided dummy bit line DDT is also lowered, the rising of voltage of sense enable signal SE is further accelerated. In particular, the common sense control line SDRL is coupled to dummy sense amplifiers DSA0 to DSAh provided corresponding to the respective divided dummy columns. Therefore, in each of these dummy sense amplifiers DSA0 to DSAh, a corresponding divided dummy bit line is discharged, MOS transistors P1 and P2 in each dummy sense amplifier are turned on, and sense enable signal SE is driven to H level at high speed. In FIG. 9, at the time t10, sense enable signal SE attains H level.

If MOS transistors N71 and N73 are not provided for discharging the divided dummy bit line, sense enable signal SE is driven by MOS transistor P2 provided for divided dummy bit line DDB causing a potential drop. Since divided dummy bit line DDB is driven by a corresponding dummy cell, the rate of the potential drop is gentle as shown in the broken line in FIG. 9, the conductance of MOS transistor P2 changes gently, accordingly, sense control line SDRL is driven gently, and sense enable signal SE attains H level of the power supply voltage VDD level at the time t9 in FIG. 9.

Therefore, by providing MOS transistors N71 and N73 in dummy sense amplifier DSA, it is possible to increase the rate of lowering the potential of the divided dummy bit line, to charge sense enable signal SE at high speed, and make the timing of activating the sense amplifier faster.

If the dummy sense amplifier shown in FIG. 8 is used, divided dummy bit lines DDT0 to DDTh and DDB0 to DDBh are discharged in accordance with sense enable signal SE. Therefore, in this case, all the divided dummy bit lines are together discharged to the ground voltage level and the stored data in the dummy cell might be unstable. However, it is sufficient that in accordance with de-selection of the selected word line, complementary data are held at storage nodes DL and DR in the dummy cell. Therefore, the potential of one of divided dummy bit lines DDT and DDB is lowered in accordance with the stored data in this dummy cell, and with dummy sense amplifier DSA shown in FIG. 8, sense enable signal SE can be driven to H level at high speed.

In this dummy sense amplifier DSA shown in FIG. 8, since sense enable signal SE is fixed at L level for the duration of precharging, the gates of MOS transistors N71 and N73 may be coupled directly to sense control line SDRL by removing P channel MOS transistors P71 and P72 and N channel MOS transistors N72 and N74.

Alternatively, in the configuration of this dummy sense amplifier shown in FIG. 8, a block select signal specifying a block including a selected word line may be generated to cause the discharging operation of the dummy sense amplifier to be activated only in a divided dummy column provided corresponding to the selected word line. In this case, in place of inverter G4, an NAND gate receiving precharge signal PRC and the block select signal specifying the block including the selected word line is arranged for each divided dummy sense amplifier. Thus, dummy sense amplifier DSA is activated only in a divided dummy column arranged corresponding to a selected word line to accelerate discharging of a corresponding dummy divided bit line for driving sense enable signal SE to H level at high speed.

As described above, in accordance with the third embodiment of the present invention, the potential change of the divided dummy bit line is accelerated in accordance with that potential change, so that the sense amplifier can be activated at a faster timing, leading to a high-speed reading operation. Furthermore, in the configuration of the dummy sense amplifier shown in FIG. 6, it is possible to shorten the time duration in which the through-current flows, and to reduce power consumption.

[Fourth Embodiment]

Figure 10:
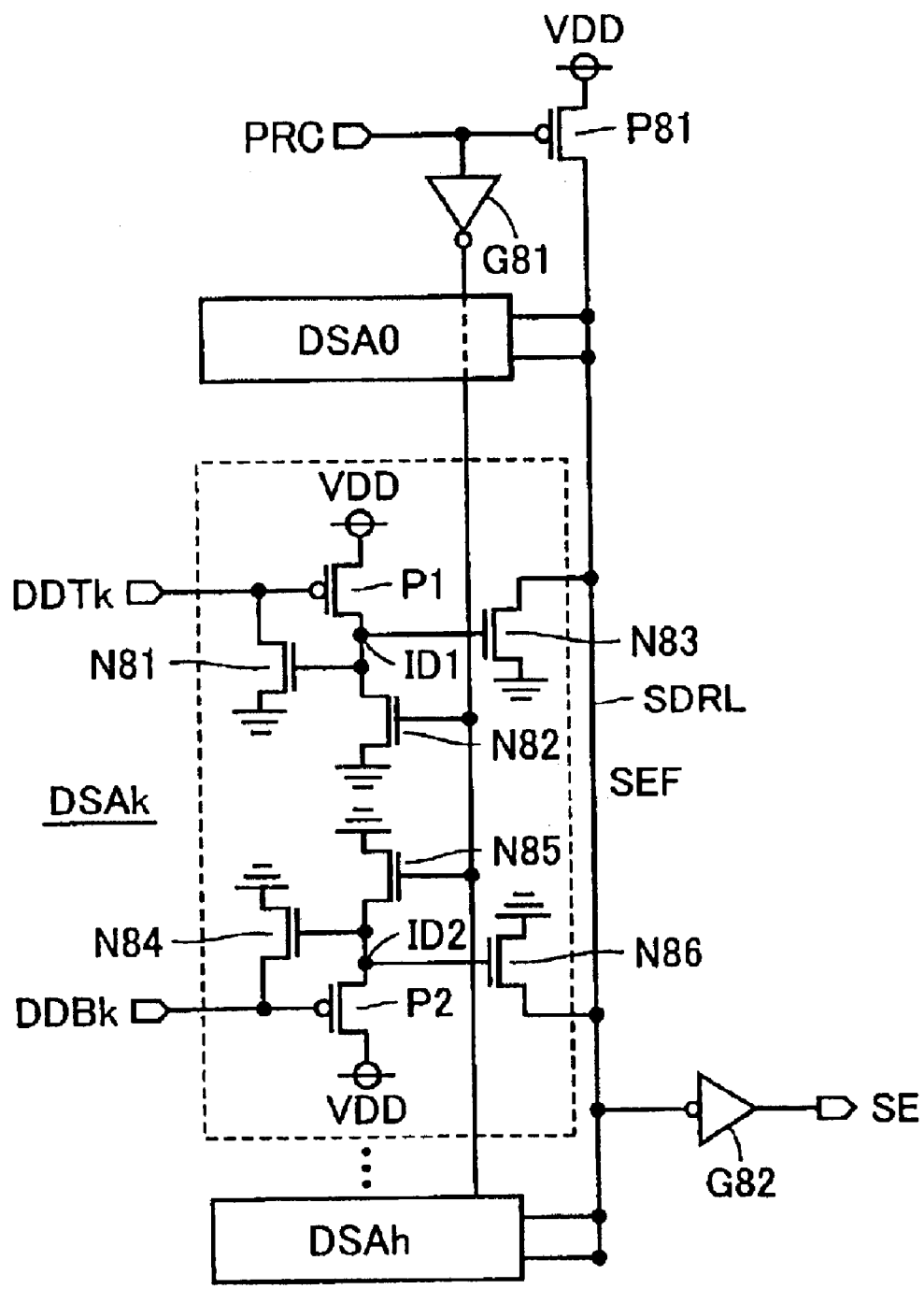
FIG. 10 is a diagram showing the configuration of the dummy sense amplifier in accordance with a fourth embodiment of the present invention.

FIG. 10 is a diagram showing the configuration of the dummy sense amplifier in accordance with a fourth embodiment of the present invention. In FIG. 10, a common inverter G81 receiving precharge signal PRC is provided for dummy sense amplifiers DSA in the divided dummy columns. Dummy sense amplifiers DSA0 to DSAh in the respective divided dummy columns (DSET0 to DSETh) are coupled to a common sense control line SDRL. This sense control line SDRL is provided with a P channel MOS transistor P81 responsive to precharge signal PRC for precharging sense control line SDRL to the power supply voltage VDD level, and an inverter 82 inverting a sense enable fast signal SEF on sense control line SDRL to generate sense enable signal SE. Sense enable fast signal SEF is driven to the power supply voltage VDD level in a precharge state and driven to L level when activated.

Sense amplifiers DSA0 to DSAh have the same configuration, and FIG. 10 therefore representatively shows the configuration of dummy sense amplifier DSAk. In FIG. 10, dummy sense amplifier DSAk includes a P channel MOS transistor P1 driving an internal node ID1 to the power supply voltage level in accordance with a voltage on divided dummy bit line DDTk, an N channel MOS transistor N81 connected between divided dummy bit line DDTk and the ground node and having its gate connected to internal node ID1, an N channel MOS transistor M82 connected between internal node ID1 and the ground node and receiving at its gate the output signal from inverter G81, and an N channel MOS transistor N83 connected between sense control line SDRL and the ground node and having its gate connected to internal node ID1. These MOS transistors P1 and N81 to N83 drive sense control line SDRL to the ground voltage level in accordance with a potential change on divided dummy bit line DDTk.

Dummy sense amplifier DSAk further includes a P channel MOS transistor P2 connected between the power supply node and an internal node ID2 and having its gate connected to divided dummy bit line DDBk, an N channel MOS transistor N84 connected between divided dummy bit line DDBk and the ground node and having its gate connected to internal node ID2, an N channel MOS transistor N85 connected between internal node ID2 and the ground node and receiving at its gate the output signal from inverter G81, and an N channel MOS transistor N86 connected between sense control line SDRL and the ground node and having its gate connected to internal node ID2.

Figure 11:
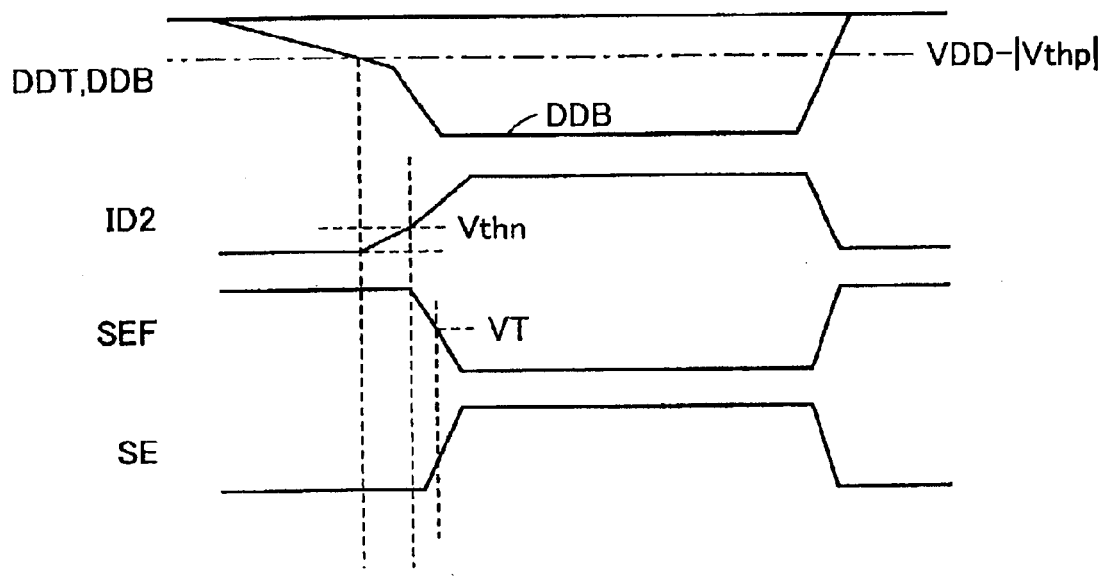
FIG. 11 is a signal waveform diagram representing the operation of the dummy sense amplifier shown in FIG. 10.

FIG. 11 is a signal waveform diagram representing an operation of the dummy sense amplifier shown in FIG. 10. In the following, referring to FIG. 11, the operation of dummy sense amplifier DSA shown in FIG. 10 will be described.

For the duration of precharging, precharge signal PRC is at L level, and the output signal of inverter G81 is at H level. Responsively, MOS transistors N82 and N85 are kept on, and MOS transistors N81 and N84 are held in an off-state. Divided dummy bit lines DDT and DDB are precharged to the power supply voltage VDD level by a corresponding dummy bit line precharge circuit (not shown). Furthermore, in accordance with precharge signal PRC at L level, MOS transistor P81 is conductive, sense enable fast signal SEF on sense control line SDRL is precharged at H level, and sense enable signal SE from inverter G82 is held at L level.

When precharge signal PRC goes to H level and the reading operation is started, the output signal from inverter G81 goes to L level. Responsively, MOS transistors P81, N82 and N85 are turned off.

When a word line is selected, a potential difference occurs between divided dummy bit lines DDB and DDT in accordance with stored data in a dummy cell. Here, it is consider a case where the voltage level of divided dummy bit line DDBk is lowered with respect to dummy sense amplifier DSAk. In this case, when the voltage level of divided dummy bit line DDBk is lowered beyond voltage VDD−|Vthp| from the precharged H level, MOS transistor P2 is rendered conductive and the voltage level of internal node ID2 rises. When the voltage level of internal node ID2 exceeds threshold voltage Vthn of N channel MOS transistor N86, MOS transistor N86 is turned on, and sense enable fast signal SEF on sense control line SDRL lowers in voltage level lowered from the precharge level. When this sense enable fast signal SEF exceeds input logical threshold VT of inverter G82, sense enable signal SE rises to H level.

At the time of discharging of this sense enable fast signal SEF, concurrently with transition of MOS transistor N86 to the on-state, MOS transistor N84 is turned on to discharge divided dummy bit line DDBk to lower its potential at-high speed. In response, MOS transistor P2 has the conductance increased to raise the gate potential of MOS transistor N86 at high speed.

By driving sense control line SDRL using N channel MOS transistors N83 and N86, the following advantage can be provided. In N channel MOS transistors, the majority carrier is electron, the current driving capability is great, and operation speed is high, as compared with P channel MOS transistors of which majority carrier is hole.

If a P channel MOS transistor is used to drive sense control line SDRL directly, the size (channel width) needs to be increased in order to increase the current driving capability of this driving P channel MOS transistor, resulting in an increased layout area. Sense control line SDRL can be driven at high speed without increasing the layout area for dummy sense amplifier DSA by driving sense control line SDRL using N channel MOS transistors N83 and N86.

Furthermore, these N channel MOS transistors N83 and N86 electrically isolate internal nodes ID1 and ID2 in dummy sense amplifier DSA from sense control line SDRL. Therefore, even when sense control line SDRL is discharged and the voltage level of sense enable fast signal SEF is lowered, the divided dummy bit line in a precharge state is kept at the precharge state. Therefore, it is not necessary to charge and discharge the divided dummy bit line in the non-selected state (the divided dummy bit line in the precharge state), thereby allowing reduction of power consumption.

[Modification]

Figure 12:
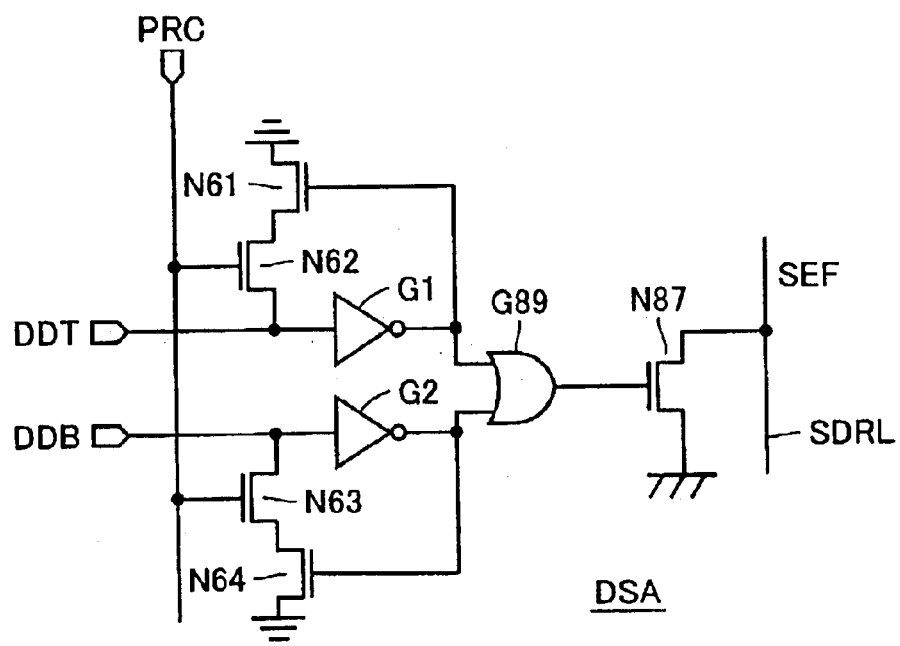
FIG. 12 is a diagram showing the configuration of the dummy sense amplifier in a modification of the fourth embodiment of the present invention.

FIG. 12 is a diagram showing the configuration of the dummy sense amplifier in a modification of the fourth embodiment of the present invention. In FIG. 12 dummy sense amplifier DSA is different in configuration from the dummy sense amplifier shown in FIG. 6 in the following points. In place of NOR gate G3 and P channel MOS transistor P0 shown in FIG. 6, there are provided an OR gate G89 receiving the output signals from inverters G1 and G2, and an N channel MOS transistor N87 discharging sense control line SDRL to the ground potential level in accordance with the output signal from this OR gate 89. This sense control line SDRL is similar to sense control line SDRL shown in FIG. 10, and is precharged to the power supply voltage VDD level by MOS transistor P81 shown in FIG. 10. Furthermore, sense enable fast signal SEF on this sense control line SDRL is inverted by inverter G82 shown in FIG. 10 to generate sense enable signal SE.

The other configuration of dummy sense amplifier DSA shown in FIG. 12 is same as the dummy sense amplifier shown in FIG. 6. Therefore the corresponding parts will be denoted with the same reference numerals and description thereof will not be repeated.

In this dummy sense amplifier DSA shown in FIG. 12, for the time duration of precharging, the output signals from inverters G1 and G2 are at L level and the output signal from OR gate G89 is at L level. Therefore, MOS transistor N87 is non-conductive, and sense enable fast signal SEF on sense control line SDRL is precharged to the power supply voltage VDD level by MOS transistor P81 shown in FIG. 10.

Upon reading data, the potential level of one of divided dummy bit lines DDT and DDB is lowered in accordance with the stored data in the selected dummy cell. Responsively, the output signal from inverter G1 or G2 goes to H level, and the output signal from OR gate G89 goes to H level. Responsively, MOS transistor N87 is turned on, and the voltage level of sense enable fast signal SEF on sense control line SDRL is lowered. MOS transistor N61 or N64 is turned on in accordance with the output signal from corresponding inverter G1 or G2, and the potential of the divided dummy bit line having its potential lowered is further lowered at high speed.

Therefore, with this dummy sense amplifier DSA shown in FIG. 12 as well, N channel MOS transistor N87 drives sense control line SDRL. Even if sense control line SDRL is coupled to a plurality of dummy sense amplifiers DSA0 to DSAh, and is great in load capacitance, sense enable fast signal SEF can be driven at high speed without increasing the layout area.

In addition, by using N channel MOS transistor N87, similarly to the configuration of the dummy sense amplifier shown in FIG. 10, the transistor size (channel width) is decreased and the junction capacitance of the output transistor N87 in the dummy sense amplifier can be decreased as compared with the case of using a P channel MOS transistor. Accordingly, it is possible to decrease the load capacitance connected to sense control line SDRL and to decrease charging/discharging current. In addition, it is possible to change sense enable fast signal SEF at high speed.

As described above, in accordance with the fourth embodiment of the present invention, sense control line SDRL having a large load capacitance is driven using an N channel MOS transistor, so that sense enable signal SE can be activated at high speed without increasing the occupied circuit area. Furthermore, the size reduction of the N channel MOS transistor at the output stage of the dummy sense amplifier allows reduction of its gate capacitance and decrease in internal node load. Thus, the internal node can be changed in voltage level at high speed in accordance with the potential change of the divided dummy bit line. In addition, the reduction of the junction capacitance can decrease the sense control line load and accordingly reduce the charging/discharging current of sense control line, leading to reduced consumption power, accordingly.

[Fifth Embodiment]

Figure 13:
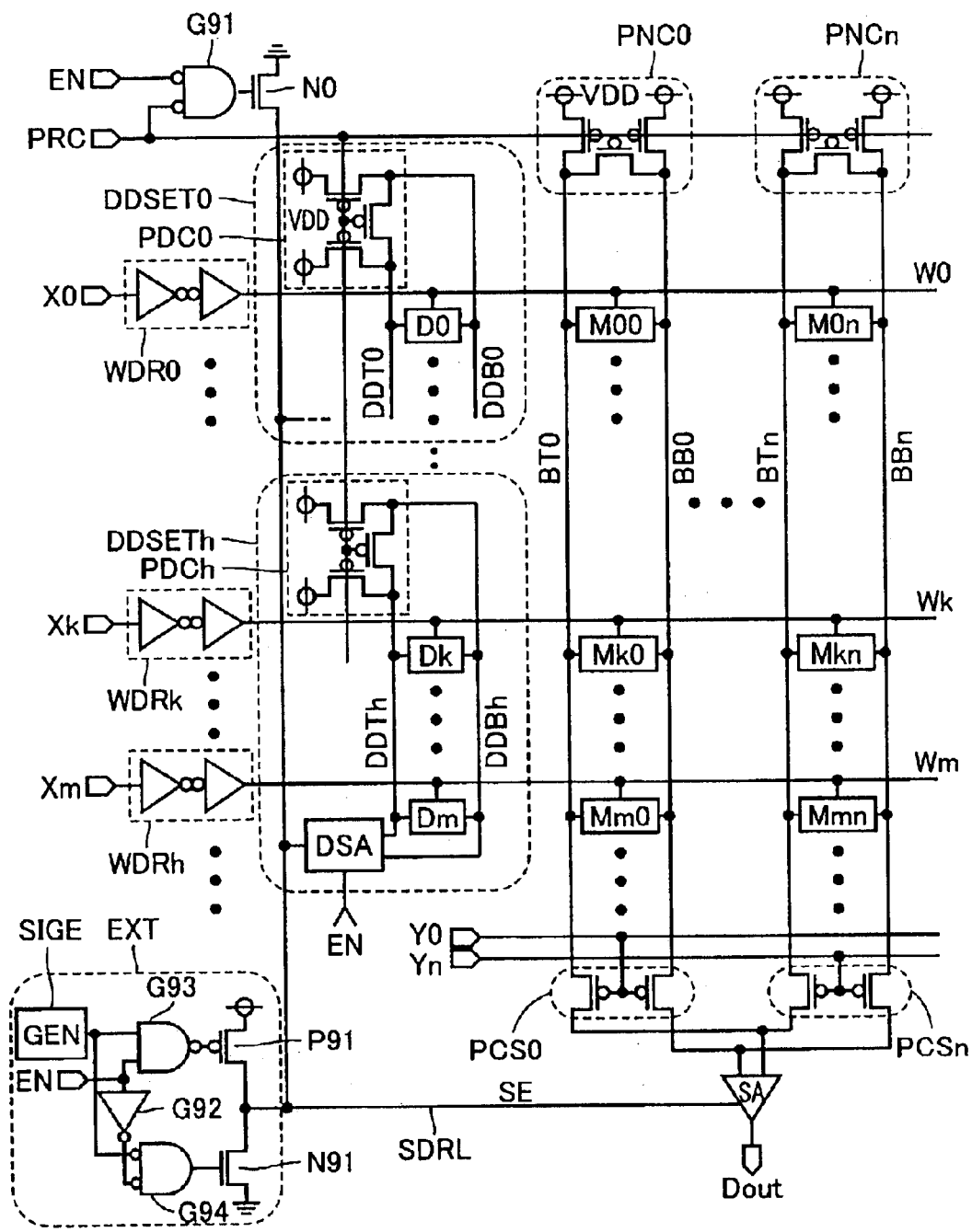
FIG. 13 is a diagram showing the configuration of the main part of SRAM in accordance with a fifth embodiment of the present invention.

FIG. 13 is a diagram showing the configuration of the main part of SRAM in accordance with a fifth embodiment of the present invention. SRAM shown in FIG. 13 is different in configuration from SRAM shown in FIG. 1 in the following point. N channel MOS transistor N0 precharging sense control line SDRL receives at its gate an output signal from NOR gate G91 receiving a mode setting signal EN and precharge signal PRC.

In addition, an external signal drive circuit EXT, which is selectively activated in accordance with a mode setting signal EN and drives sense control line SDRL to generate sense enable signal SE in accordance with external signal SIGE when activated, is provided for this sense control line SDRL.

Dummy sense amplifiers DSA receive mode setting signal EN, and in activation of external signal drive circuit EXT, these dummy sense amplifiers DSA are set in an output high impedance state.

The other configuration of this SRAM shown in FIG. 13 is the same as the configuration of SRAM shown in FIG. 1.

The corresponding parts will be denoted with the same reference numerals and detailed description thereof will not be repeated.

External signal drive circuit EXT includes an inverter G92 receiving mode setting signal EN, a signal generation circuit GEN generating an internal signal in accordance with an externally applied signal SIGE, an NAND gate G93 receiving an output signal from signal generation circuit GEN and mode setting signal EN, an NOR gate G94 receiving the output signal from inverter G92 and the output signal from signal generation circuit GEN, a P channel MOS transistor P91 driving sense control line SDRL to the power supply voltage level in accordance with an output signal from NAND gate G93, and an N channel MOS transistor N91 driving sense control line SDRL to the ground voltage level in accordance with an output signal from NOR gate G94.

Mode setting signal EN is fixedly set depending on whether this SRAM is a high speed operating memory or a low speed operating memory. This mode setting signal EN is has a potential level fixedly set by fixing a potential of a specific bonding pad through a mask interconnection. Signal generation circuit GEN generates an internal signal to activate sense enable signal SE, in accordance with external signal SIGE.

If mode setting signal EN is set at H level, NAND gate G93 and NOR gate G94 each operate as an inverter, and MOS transistors P91 and N91 are selectively turned on in accordance with the output signal from signal generation circuit GEN. When the output signal of signal generation circuit GEN is driven to H level, the output signal of NAND gate G93 goes to L level, MOS transistor P91 drives sense control line SDRL to the power supply voltage VDD level, and sense enable signal SE is activated.

When the output signal from signal generation circuit GEN goes to L level, the output signal of NOR gate G94 goes to H level, MOS transistor N91 is turned on, and sense control line SDRL is driven to the ground voltage level.

If mode setting signal EN is set at L level, irrespective of the output signal from signal generation circuit EXT, the output signal of NAND gate G93 goes to H level, the output signal of NOR gate G94 goes to L level, and MOS transistors P91 and N91 are turned off. Therefore, when this mode setting signal EN is set at L level, external signal drive circuit EXT enters an output high impedance state.

Figure 14:
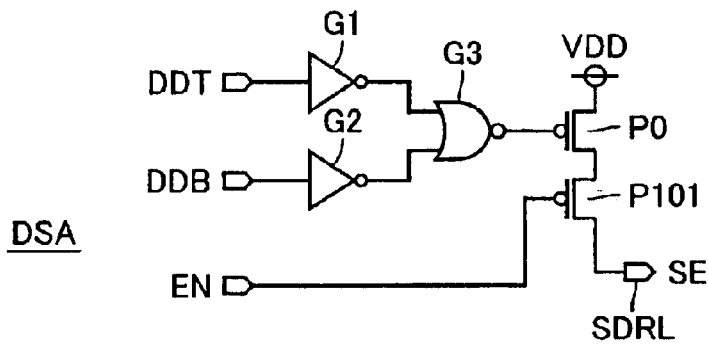
FIG. 14 is a diagram showing the configuration of the dummy sense amplifier shown in FIG. 13.

FIG. 14 is a diagram showing an exemplary configuration of dummy sense amplifier DSA shown in FIG. 13. This dummy sense amplifier DSA shown in FIG. 14 corresponds to configuration of the dummy sense amplifier shown in FIG. 10, and a P channel MOS transistor P101 receiving at its gate mode setting signal EN is provided between P channel MOS transistor P0 at the output stage and sense control line SDRL.

In the configuration of this dummy sense amplifier DSA shown in FIG. 14, when mode setting signal EN is at H level, P channel MOS transistor P101 is non-conductive, and this dummy sense amplifier DSA enters an output high impedance state and has no effect on the potential change of sense control line SDRL.

On the other hand, when mode setting signal EN is set at L level, P channel MOS transistor P101 is conductive, and sense control line SDRL is electrically coupled to MOS transistor P0. Therefore, in this state, sense control line SDRL is charged in accordance with the potential change in divided dummy bit lines DDT and DDB.

It should be noted that in the configuration of this dummy sense amplifier DSA shown in FIG. 14, NOR gates having their respective first inputs receiving mode setting signal EN and having their respective second inputs coupled to corresponding divided dummy bit lines DDT and DDB may be used in place of inverters G1 and G2, respectively. Although the layout area is slightly increased, the charging/discharging path of dummy sense amplifier DSA can be cut off when mode setting signal EN is set at H level, thereby leading to reduced current consumption.

When mode setting signal EN is set at H level, external signal drive circuit EXT is activated and sense enable signal SE is generated in accordance with external signal SIGE. In this state, as shown in FIG. 14, dummy sense amplifier DSA is in an output high impedance state. On the other hand, when mode setting signal EN is set at L level, this external signal drive circuit EXT enters an output high impedance state, and sense enable signal SE is driven in accordance with dummy sense amplifier DSA detecting a potential change.

In the preceding first to fourth embodiments, potential difference $\Delta Vs$ between the bit line pair upon starting of activation of sense amplifier SA is set to a minimum value with a sensing margin taken into account, in order to ensure a high-speed reading. Memory cell transistors are shrunk in size with improvement in sub-micron process techniques, resulting in increased effect on the characteristics of memory cell transistors due to variations in manufacturing parameters, and the operation characteristics of thus miniaturized memory cell transistors tend to vary more significantly. The driving current by the memory cell transistors is small because of the size shrinking. When variation in transistor characteristics is great, an amount of driving current varies and the amount of the small driving current is even further reduced. Therefore, as the potential difference between bit line pair at the time of activation of sense amplifier is set at a smaller value, such memory cells increase that can not ensure the potential difference between bit line pair as designed, if an amount of driving current is reduced because of the variations in memory cell transistor characteristics. With even a single memory cell as such being preset, this SRAM is determined defective because data can not be read correctly therefrom.

In recent semiconductor integrated circuits, as in system LSI, a plurality of SRAMs are usually supported on a single chip. These SRAMs are assigned with individual applications, and all of the SRAMs have not a high-speed operation required. For example, SRAM for use in data processing is required of a high-speed operation, while SRAM for simply holding data is not required of a high-speed operation. Therefore, for SRAM having the high-speed operation required, it is required to apply the configurations shown in the first to fourth embodiments described above to activate sense enable signal SE at high speed. For the low-speed operation SRAM, however, if an external low-speed signal can be supplied as the sense enable signal separately from sense enable signal SE generated from the dummy sense amplifier, such low-speed operation SRAM carries out the sensing operation with the potential difference between bit lines being sufficiently developed, and thus, the production yields thereof will be improved, resulting in an improved production yields of chips.

If the reading operation in a memory cell is determined defective in SRAM, an operation test needs to be carried out by activating the sense amplifier with a signal other than sense enable signal SE generated from the dummy sense amplifier, in order to identify whether the cause of the defect is an excessively advanced timing for activating sense enable signal SE or the failure of the memory cell itself.

With the external signal drive circuit as shown in FIG. 13, dummy sense amplifiers DSA and external signal drive circuit EXT are selectively activated in accordance with mode setting signal EN. Consequently, the operation mode of SRAM can be set either to setting of the activation timing of sense amplifier SA with dummy sense amplifiers DSA or to that by the external signal SIGE. External signal SIGE is used to low-speed operating SRAM as the sense amplifier activating signal, to activate the sense amplifier SA when the potential difference between a bit line pair is fully developed. Consequently, the product yield of low-speed operating SRAM can be improved and accordingly, a whole chip such as a system LSI has the product yield improved. In addition, if the external signal SIGE is employed as the sense amplifier activating signal in failure analysis, it can be identified whether the failure cause is the memory cell itself or the sense amplifier activating timing failure.

Signal generation circuit GEN needs only to generate a signal that drives sense enable signal SE in accordance with external signal SIGE, and may be a buffer circuit. In addition, output enable signal OE, for example, may be applied as this external signal SIGE, and signal generation circuit GEN may generate an internal output enable signal to activate sense enable signal SE. Further, signal generation circuit GEN may be such a circuit that generates a signal being at H level for a certain period of time after a prescribed time period from an address transition or a rising of precharge signal PRC.

[Modification of Dummy Sense Amplifier]

Figure 15:
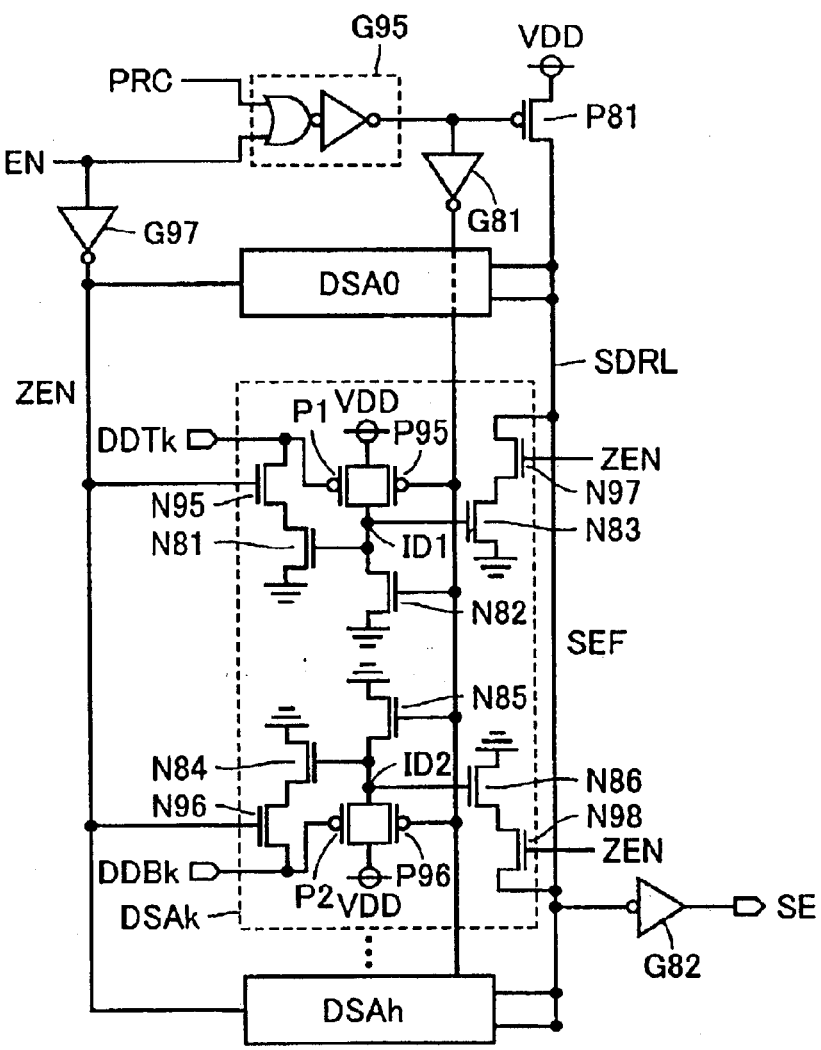
FIG. 15 is a diagram showing a modification of the fifth embodiment of the present invention.

FIG. 15 is a diagram showing a modification of the dummy sense amplifier of the fifth embodiment of the present invention. In FIG. 15, an inverter G97 receiving mode setting signal EN and an OR circuit G95 receiving precharge signal PRC and mode setting signal EN are provided in order to control dummy sense amplifiers DSA0 to DSAh. The output signal from OR circuit G95 is applied to inverter G81 and to the gate of P channel MOS transistor P81.

These dummy sense amplifiers DSA0 to DSAh are different in configuration from dummy sense amplifiers DSA0 to DSAh shown in FIG. 10 in the following point. Similarly to FIG. 10, FIG. 15 representatively shows the configuration of dummy sense amplifier DSAk. In this dummy sense amplifier DSAk, an N channel MOS transistor N95 receiving at its gate a complementary mode setting signal ZEN from inverter G97 is connected between divided dummy bit line DDTk and MOS transistor N81, and an N channel MOS transistor N96 receiving at its gate complementary mode setting signal ZEN is arranged between divided dummy bit line DDBk and MOS transistor N84.

Furthermore, an N channel MOS transistor N97 receiving at its gate the complementary mode setting signal ZEN is provided between sense control line SDRL and MOS transistor N83. An N channel MOS transistor N98 receiving at its gate the complementary mode setting signal ZEN is further arranged between sense control line SDRL and MOS transistor N86.

In addition, a P channel MOS transistor P95 receiving at its gate the output signal of inverter G81 is connected in parallel with MOS transistor P1, and a P channel MOS transistor P96 is connected in parallel with MOS transistor P2.

The other configuration of this dummy sense amplifier DSAk shown in FIG. 15 is same as the configuration of dummy sense amplifier DSAk shown in FIG. 10. The corresponding parts will be denoted with the same reference numerals and the detailed descriptions thereof will not be repeated.

When mode setting signal EN is set at H level, the output signal of OR circuit G95 goes to H level, and the output signals of inverters G81 and G97 go to L level. Responsively, all MOS transistors N82, N85, N95 and N96 are kept non-conductive, and MOS transistors P95 and P96 are kept conductive. Therefore, internal nodes ID1 and ID2 are fixed at the power supply voltage VDD level by MOS transistors P95 and P96. Since these internal nodes ID1 and ID2 are fixed at the power supply voltage VDD level, MOS transistors N81, N83, N84 and N86 are conductive, so that the internal nodes in this dummy sense amplifier DSAk are prevented from entering a floating state.

In this state, even if the potential level of divided dummy bit line DDTk or DDBk is lowered, the voltage level of internal nodes ID1 and ID2 are at the power supply voltage VDD level and the potential of internal nodes ID1 and ID2 does not change.

On the other hand, when mode setting signal EN is set at L level, the output signals of inverters G81 and G97 attains H level, and OR circuit G95 operates as a buffer circuit. Therefore, all MOS transistors N96 to N98 are enter the on-state, and MOS transistors P95 and P96 enter the off-state. Therefore, in this state, the similar operation as in the dummy sense amplifier shown in FIG. 10 is carried out, and sense control line SDRL is driven in accordance with the potential change of the divided dummy bit line.

Similarly, dummy sense amplifier DSA can be selectively activated/inactivated in accordance with mode setting signal EN also in the configuration as shown in FIG. 15 that has a feedback path of detecting the potential change of the dummy bit line and further accelerating the potential change of the corresponding divided dummy bit line in accordance with that detection result.

As described above, in accordance with the fifth embodiment of the present invention, the activation/inactivation of sense enable signal SE can be controlled in accordance with an external signal. Thus, SRAM operating at low speed can be implemented, and the sensing operation can be performed under the condition of fully developed bit line pair potential difference at the time of sense amplifier operation, thereby leading to improved production yields. In addition, it is possible to identify the cause for defect by operating the sense amplifier using this external signal.

[Sixth Embodiment]

Figure 16:
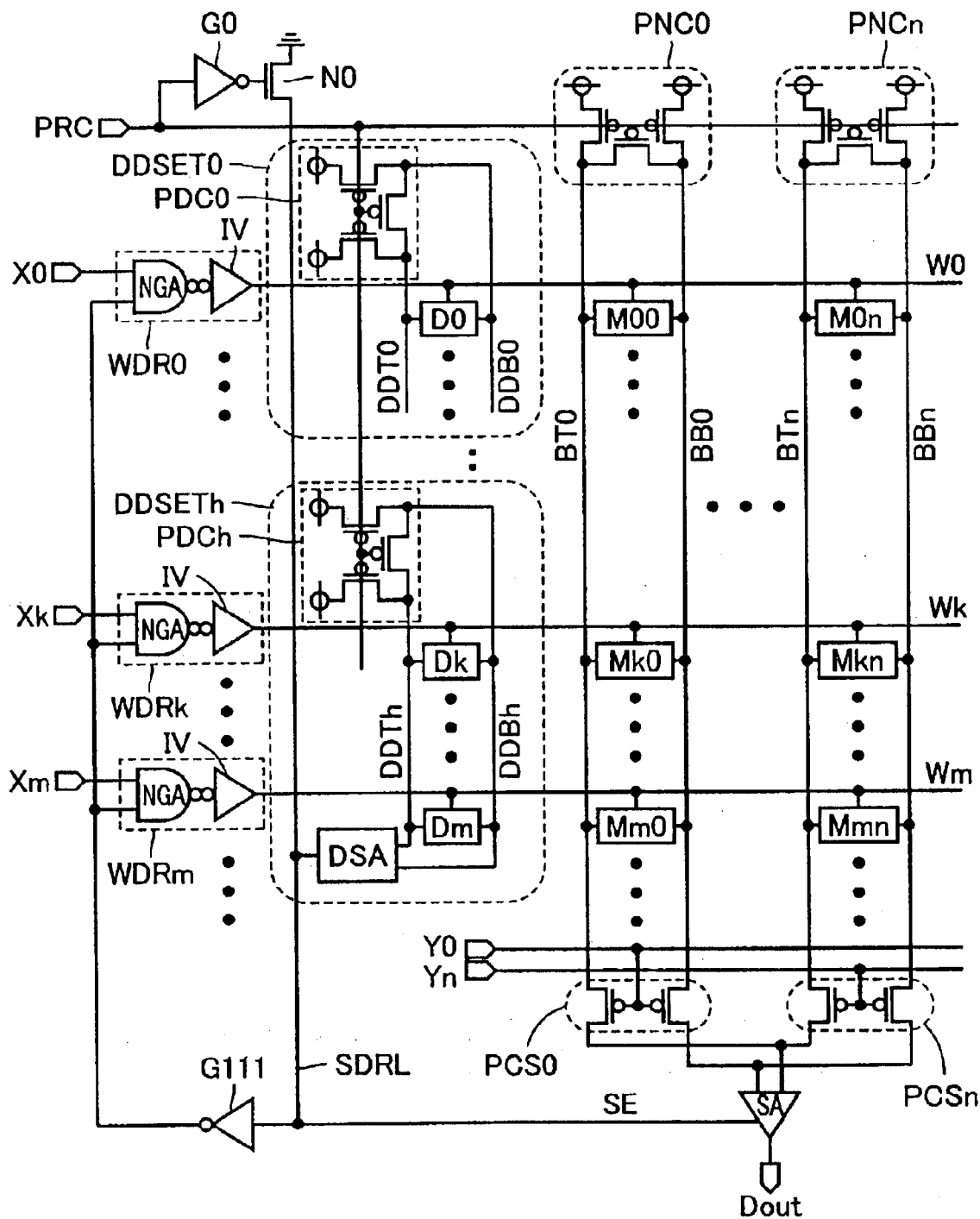
FIG. 16 is a diagram showing the configuration of a main part of SRAM in accordance with a sixth embodiment of the present invention.

FIG. 16 is a diagram schematically showing the configuration of the main part of SRAM in accordance with a sixth embodiment of the present invention. This SRAM shown in FIG. 16 is different in configuration from SRAM shown in FIG. 1 in the following point. An inverter G111 is provided which inactivates word line drive circuits WDR0 to WDRm in accordance with sense enable signal SE on sense control line SDRL.

Each of word line drive circuits WDR0 to WDRm is, by way of example, configured using an NAND gate NGA receiving the respective row select signals X0 to Xm and the output signal of inverter G111, and an inverter IV receiving the output signal from the NAND gate NGA.

The other configuration of this SRAM shown in FIG. 16 is the same as SRAM shown in FIG. 1. Therefore, the corresponding parts will be denoted with the same reference numerals and detailed description thereof will not be repeated.

It is assumed that dummy sense amplifier DSA has the same configuration as the sense amplifier shown in FIG. 6 or FIG. 8.

Figure 17:
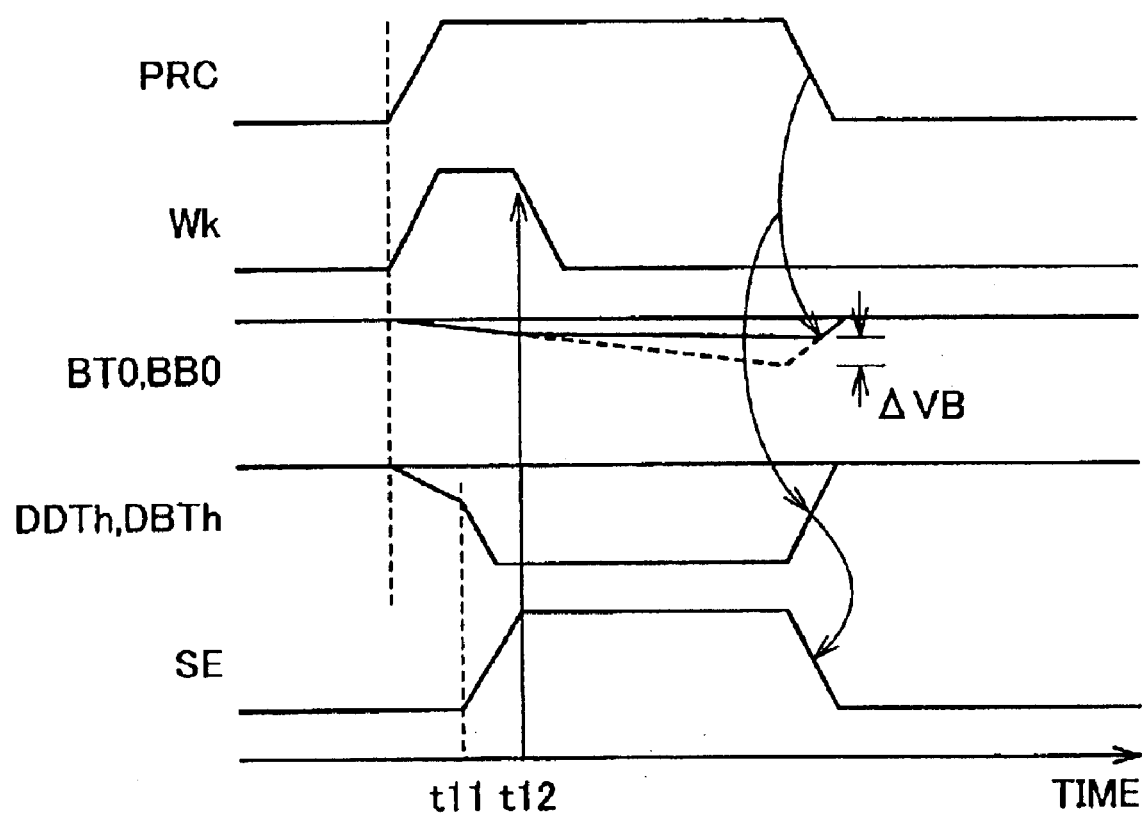
FIG. 17 is a signal waveform diagram representing the operation of SRAM shown in FIG. 16.

FIG. 17 is a timing diagram representing the operation of SRAM shown in FIG. 16. In the following, referring to FIG. 17, the operation of SRAM shown in FIG. 16 will be described.

When precharge signal PRC rises, concurrently, row select signal Xk is selected and the voltage level thereof rises to H level. For the time duration of precharging, sense enable signal SE is precharged to L level, and the output signal of inverter G111 is at H level. Therefore, word line drive circuit WDRk raises the corresponding word line Wk to H level in accordance with row select signal Xk. When the voltage level of this word line Wk rises, dummy memory cell Dk and normal memory cells Mk0 to Mkn are selected, and a potential difference occurs between the corresponding bit line pairs in accordance with the stored data. Specifically, by the selected dummy cell Dk, the potential of either one of divided dummy bit lines DDTh and DDBh is lowered. Furthermore, by the selected normal memory cell, the potential of either one of normal bit lines BT0 and BB0 is lowered.

At the time t11, when the potential of divided dummy bit line DDTh or DDBh is lowered beyond the threshold of dummy sense amplifier DSA, sense control line SDRL is driven and sense enable signal SE rises to H level. Furthermore, concurrently, the divided dummy bit line causing the potential lowering is discharged at high speed in dummy sense amplifier DSA.

When sense enable signal SE rises to H level, the output signal of inverter G111 goes to L level, and in word line drive circuit WDRk, the output signal of NAND gate NGA goes to H level and the output signal of inverter IV at the next stage responsively goes to L level. As a result, the selected word line Wk is driven to a non-selected state. When this selected word line Wk is driven to the non-selected state, normal memory cell Mk0 is isolated from bit lines BT0 and BB0, and the potential of bit line BT0 or BB0 stops from being lowered.

In the configuration of the first embodiment, the inactivation of the selected word line is performed in synchronization with the falling of precharge signal PRC. The normal memory cell has its storage node connected to the corresponding normal bit line in sensing operation, and the potential of the corresponding normal bit line continues to be lowered. Therefore, the normal bit line is charged after the potential difference between bit line pair becomes large in accordance with the rising of precharge signal PRC.

Now, it is considered a situation where the potential of the normal bit line is further lowered to ΔVB from the start of sensing operation until the start of precharging when bit lines BT0 and BB0 are charged in response to the rising of precharge signal PRC. In this case, assuming that the parasitic capacitance of the bit line is Cb and the operating frequency is F, the number of normal memory cells selected by a word line is (n+1), and power consumption P is expressed by the following equation.

$$P = I \cdot V = Cb \cdot (n+1) \cdot \Delta VB \cdot F \cdot VDD$$

When the bit line capacitance Cb is 0.5 pF, the potential drop ΔVB is 0.5V, the operating frequency F is 200 MHz, the number of normal memory cells, (n+1), is 512, and the power supply voltage VDD is 1.8V, the power consumption P is 46 mW. Therefore, by inactivating the word line at a faster timing in sensing operation, the power P required for charging the bit line can be reduced and power consumption can further be reduced.

The discharging of the normal bit line is stopped by driving the word line to the non-selected state at a faster timing. Power consumption at the time of charging the bit line can be reduced by preventing an increase in potential difference between bit line pair. In sense amplifier SA, the sensing operation is performed according to charge confinement scheme, and the potential of normal bit lines BT0 and BB0 after activation of sense enable signal SE does not exert any effect on the sensing operation. Therefore, power consumption can be reduced without any effect on the sensing operation of the sense amplifier. Furthermore, the bit line can be driven to the power supply voltage VDD level at high speed in charging the bit line, and the bit line can be recovered to the precharge state at a faster timing after inactivating precharge signal PRC.

As described above, according to the sixth embodiment of the present invention, after the potential difference between bit line pair reaches the range enabling the sensing operation by the sense amplifier, the selected word line is driven to the non-selected state to cu off the column current on the bit line, so that power consumption can be reduced without any adverse effect on the internal data reading operation.

It is noted that the foregoing description is premised on the configuration shown in FIG. 6 or FIG. 8 as a configuration of dummy sense amplifier DSA. However, any dummy sense amplifier in the preceding first to fifth embodiments may be used.

[Seventh Embodiment]

Figure 18:
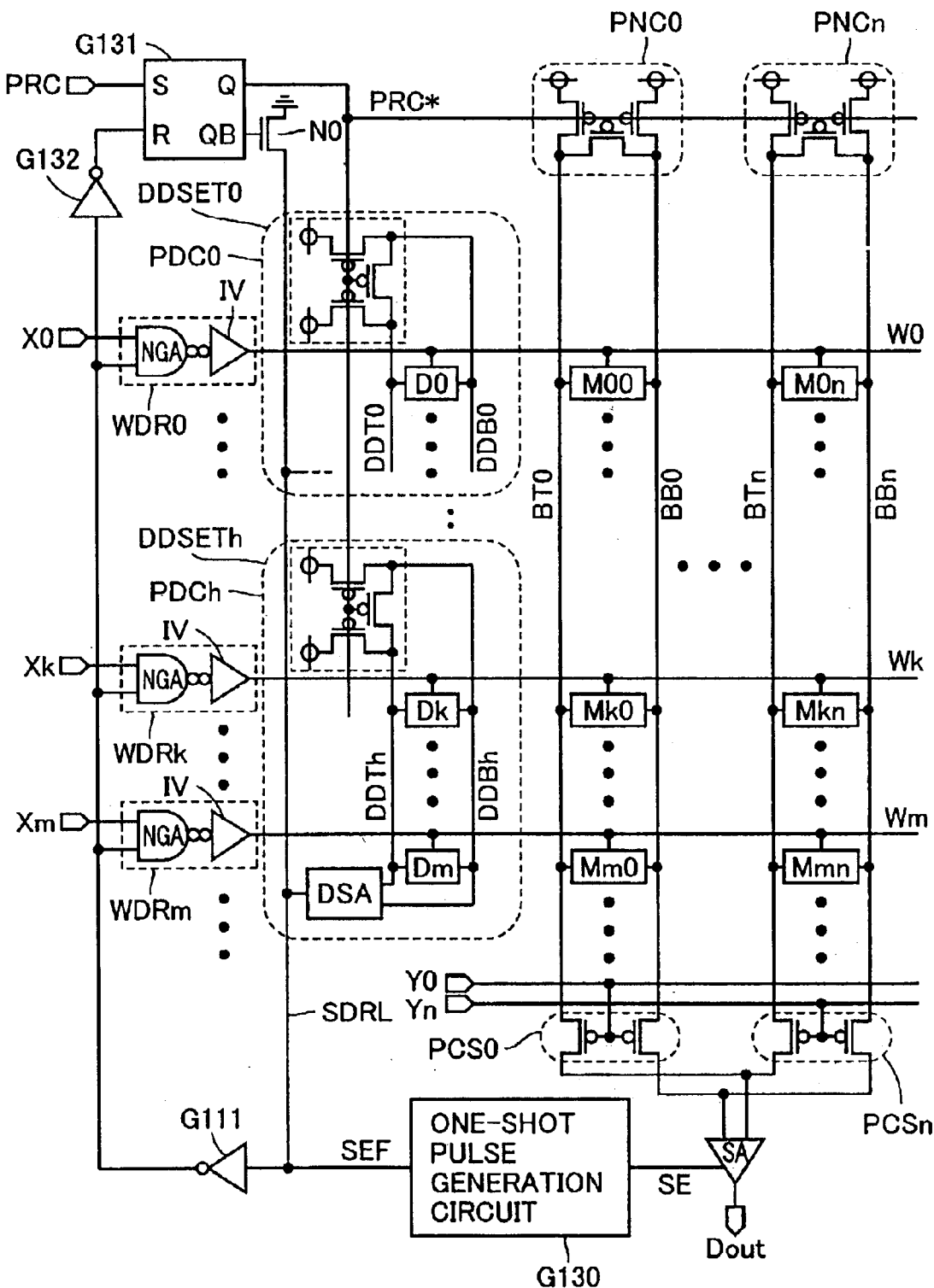
FIG. 18 is a diagram showing the configuration of a main part of SRAM in accordance with a seventh embodiment of the present invention.

FIG. 18 is a diagram showing the configuration of a main part of SRAM in accordance with a seventh embodiment of the present invention. The configuration of this SRAM shown in FIG. 18 is different in configuration from SRAM shown in FIG. 16 in the following point. There are provided an inverter G132 receiving the output signal of inverter G111, and a set/reset flip-flop G131 set in response to the rising of precharge signal PRC and reset in response to the rising of the output signal of inverter G132. Activation/inactivation of precharge circuits PCD0 to PDCh and PNC0 to PNCn is controlled in accordance with a precharge instruction signal PRC* from an output Q of set/reset flip-flop G131. On/off of MOS transistor N0 precharging sense control line SDRL to the ground voltage level is controlled in accordance with the output signal from a complementary output QB of set/reset flip-flop G131.

A one-shot pulse generation circuit G130 is also provided which generates to sense amplifier SA a one-shot pulse signal as sense enable signal SE in accordance with sense enable fast signal SEF on sense control line SDRL.

The other configuration of this SRAM shown in FIG. 18 is the same as the configuration of SRAM shown in FIG. 16. Therefore, the corresponding parts are denoted with the same reference numerals and the detailed description thereof will not be repeated.

Figure 19:
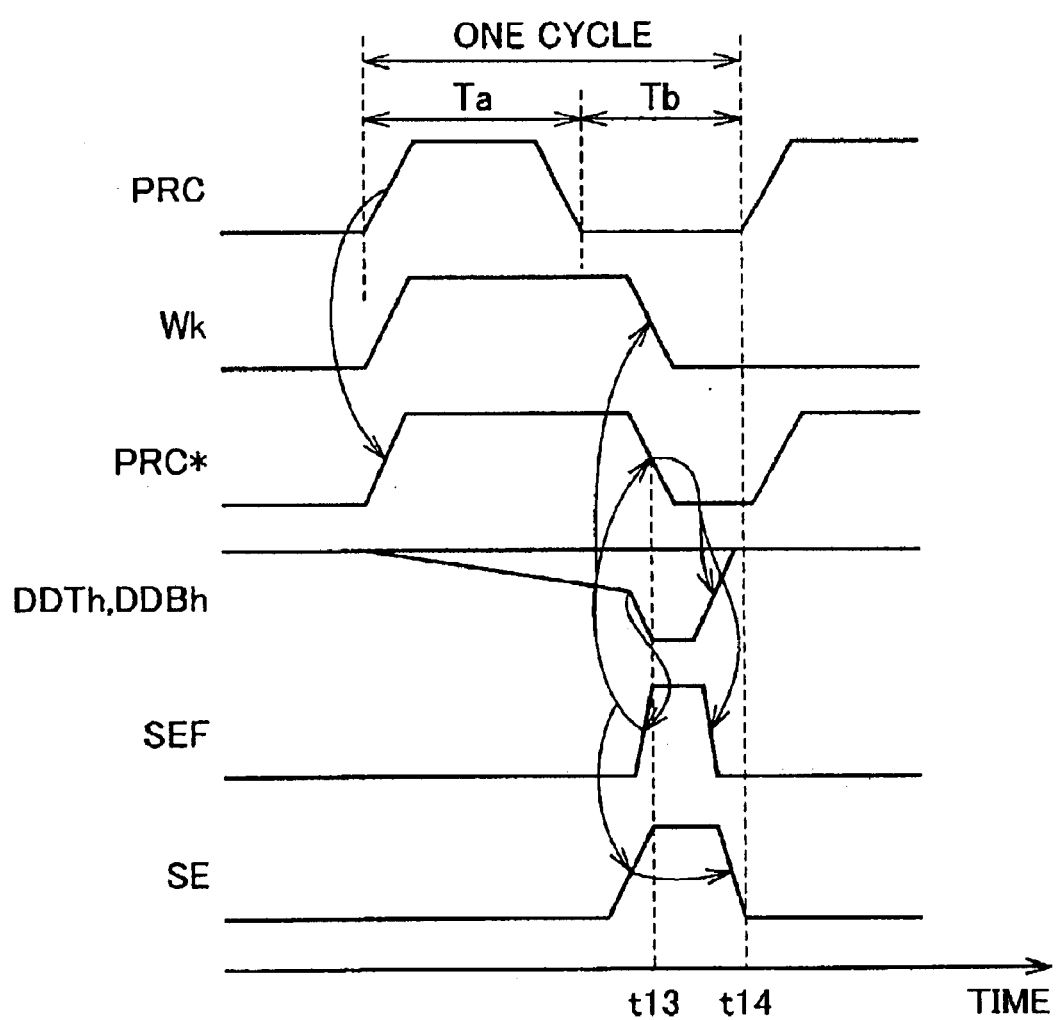
FIG. 19 is a signal waveform diagram representing the operation of SRAM shown in FIG. 18.

FIG. 19 is a signal waveform diagram representing an operation of SRAM shown in FIG. 18. In the following, referring to FIG. 19, the operation of SRAM shown in FIG. 18 will be described. In this SRAM shown in FIG. 18, the dummy sense amplifier having the configuration shown in FIG. 6 or FIG. 8 is assumed as dummy sense amplifier DSA. However, any dummy sense amplifier in the preceding first to fifth embodiments may be used as dummy sense amplifier DSA.

When precharge signal PRC rises to H level, set/reset flip-flop G131 is set, precharge instruction signal PRC* rises to H level, precharge circuits PCD0 to PDCh and PNC0 to PNCn are inactivated, and the precharging operation is completed on divided dummy bit lines DDT0, DDB0 to DDTh, DDBh and bit lines BT0, BB0 to BTn, BBn.

The row select operation is performed in synchronization with the rising of this precharge signal PRC, and the voltage level of the selected word line Wk rises.

When the voltage of selected word line Wk rises, a potential difference occurs between divided dummy bit lines DDTh and DDBh in accordance with the stored data in dummy cell Dk.

When the potential difference between divided dummy bit lines DDTh and DDBh is increased, through the detection operation of dummy sense amplifier DSA, sense enable fast signal SEF on sense control line SDRL rises to H level, and sense enable signal SE from one-shot pulse generation circuit G130 is responsively driven to H level. Furthermore, in response to the rising of sense enable fast signal SEF, the output signal of inverter G1 goes to L level, all word line drive circuits WDR0 to WDRm are inactivated, and the voltage level of the selected word line Wk is lowered to the ground voltage level. The discharging is terminated in normal bit line BT0 or BB0.

Furthermore, the output signal of inverter G132 goes to H level in response to the rising of this sense enable fast signal, set/reset flip-flop G130 is reset, and precharge instruction signal PRC* goes to L level. Responsively, precharge circuits PCD0 to PDCh and PNC0 to PNCn are activated, and the precharging operation is started on divided dummy bit lines DDT0, DDB0 to DDTh, DDBh and normal bit lines BT0, BB0 to BTn, BBn.

Furthermore, MOS transistor N0 is turned on in accordance with the output signal from the complementary output QB of set/reset flip-flop G131, and sense enable fast signal SEF on sense control line SDRL falls to L level.

One-shot pulse generation circuit G130 generates a one-shot pulse signal in response to the rising of sense enable fast signal SEF, and maintains sense enable signal SE at H level for a prescribed time period even when sense enable fast signal SEF falls to L level during the sensing operation of sense amplifier SA.

In sense amplifier SA, the sensing operation is performed in a charge-confinement scheme in response to the activation of sense enable signal SE from one-shot pulse generation circuit G130. Therefore, the sensing operation can be performed with accuracy without any influence from the precharge operation on the divided dummy bit line and the normal bit line during the sensing operation.

Thereafter, at the time t4, precharge signal PRC rises to H level, set/reset flip-flop G130 is set, and precharge instruction signal PRC* rises to H level, so that the internal reading operation is started again.

Precharge signal PRC is a signal synchronized with an external clock signal. The clock signal is utilized in other logic circuit in the system as a signal for defining an operation cycle/timing. Therefore, the duty ratio of this clock signal is set at 50%. That is, H level period Ta and L level period Tb of precharge signal PRC are set to the same duration of time. In the case of SRAM, the data reading operation requires a long time. Therefore, if the data reading period is decided in accordance with precharge signal PRC, H level period of precharge signal PRC can not be shortened. As a result, the data reading period of SRAM may hinder speeding up the clock signal.

However, the data reading operation needs not be completed within H level period Ta of precharge signal PRC by internally generating precharge instruction signal PRC* to surely hold the reading time period. Therefore, a high-speed system can be constructed by changing precharge signal PRC in synchronization with a high-speed clock signal and operating the logic circuits within the system at high speed.

Furthermore, the rising of precharge instruction signal PRC* is determined by the rising of precharge signal PRC. Therefore, as this operational frequency is increased, the time period during which precharge instruction signal PRC* is at L level is automatically reduced. Thus, this SRAM can be operated accurately until the sum of respective minimum time periods required for the reading and precharge operations becomes equal to one cycle time period of the clock signal.

It is noted that the falling of sense enable signal SE may not be completed before the rising of precharge instruction signal PRC*. Even if sense enable signal SE falls after precharge instruction signal PRC* rises, the internal nodes of sense amplifier SA are isolated from the selected bit lines while sense enable signal SE is being at H level, and any problem may not internally occur such as data collision. When data sampling is performed in synchronization with the clock signal in an external device, the read data from SRAM needs only to be in a definite state at the time of data sampling in the external device.

As described above, in accordance with the seventh embodiment of the present invention, precharge instruction signal PRC* which defines the reading and precharge time periods is internally generated in accordance with precharge signal PRC. Thus, the reading time period and precharge time period can be set individually, resulting in a higher operational frequency.

[Eighth Embodiment]

Figure 20:
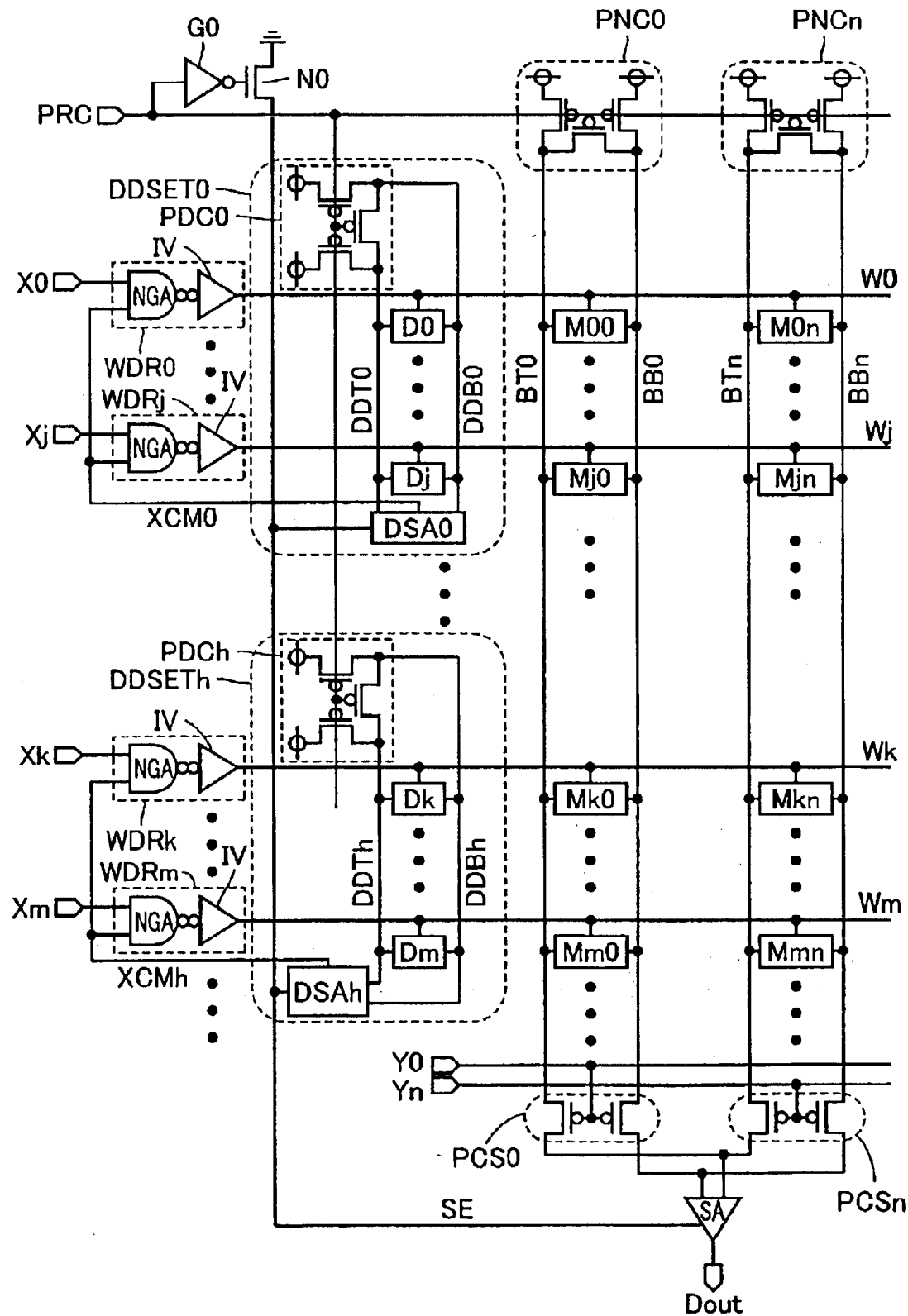
FIG. 20 is a diagram showing the configuration of a main part of SRAM in accordance with an eighth embodiment of the present invention.

FIG. 20 is a diagram showing the configuration of a main part of SRAM in accordance with an eighth embodiment of the present invention. This SRAM shown in FIG. 20 is different in configuration from SRAM shown in FIG. 16 in the following point. The word line drive circuits are divided into groups corresponding to divided dummy columns DDSET0 to DDSETh, respectively. In FIG. 20, word line drive circuits WDR0 to WDRj are arranged for divided dummy column DDSET0, while word line drive circuits WDRk to WDRm are provided for divided dummy column DDSETh. The word line drive circuits in each group are supplied with a word line inactivating signal XCM from a corresponding dummy sense amplifier DSA in place of the output signal of common inverter G111 shown in FIG. 16. In FIG. 20, a word line inactivating signal XCM0 from dummy sense amplifier DSA0 provided for divided dummy column DDSET0 is applied to first inputs of NAND gates NGA at the first stages of word line drive circuits WDR0 to WDRj. On the other hand, in divided dummy column DDSETh, a word line inactivating signal XCMh from the corresponding dummy sense amplifier DSAh is applied to first inputs of NAND gates NGA at the input first stages of word line drive circuits WDRk to WDRm. The corresponding row select signals X0 to Xm are applied to the second inputs of the respective NAND gates at the input stage of word line drive circuits WDR0 to WDRm.

The other configuration of SRAM shown in FIG. 20 is the same as the configuration of SRAM shown in FIG. 16. Therefore, the corresponding parts will be denoted with the same reference numerals and the detailed description thereof will not be repeated.

Figure 21:
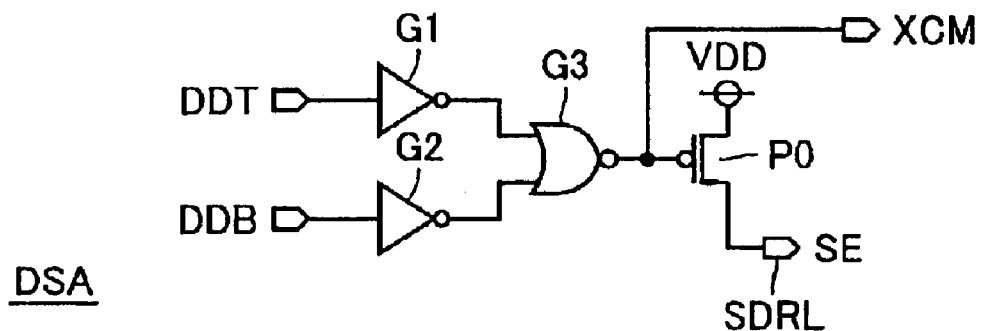
FIG. 21 is a diagram showing the configuration of the dummy sense amplifier shown in FIG. 20.

FIG. 21 is a diagram showing an exemplary configuration of dummy sense amplifiers DSA0 to DSAh shown in FIG. 20. Since these dummy sense amplifiers DSA0 to DSAh have the same configuration, FIG. 21 representatively shows dummy sense amplifier DSA. In FIG. 21, dummy sense amplifier DSA has a configuration similar to that of the dummy sense amplifier shown in FIG. 2. The output signal of NOR gate G3 is led out as word line inactivating signal XCM to be applied to word line drive circuit WDR in the corresponding group.

Any dummy sense amplifier shown in the preceding first to fifth embodiments may be used as dummy sense amplifiers DSA0 to DSAh. A signal having an inverted logic level of sense enable signal SE is utilized as word line inactivating signal XCM.

The operation of this SRAM shown in FIG. 20 in reading data is substantially the same as the operation of SRAM shown in FIG. 16 in reading data. More specifically, concurrently with the rising of precharge signal PRC, row select signal Xk corresponding to an addressed row is selected and driven to H level. Word line Wk is selected by word line drive circuit WDRk and its voltage level rises to H level. In response to the selected word line Wk being driven to the selected state, dummy cell Dk and normal memory cells Mk0 to Mkn are selected. The potential of divided dummy bit line DDTh or DDBh is lowered by selected dummy cell Dk. Furthermore, in normal bit lines BT0 and BB0 corresponding to the selected column, the potential of either one of bit lines BT0 and BB0 is lowered by the selected normal memory cell Mk0.

When the potential of one of divided dummy bit lines DDTh and DDBh is lowered beyond the input logic threshold of dummy sense amplifier DSAh, in dummy sense amplifier DSA shown in FIG. 21, the output signal from one of inverters G1 and G2 goes to H level, word line inactivating signal XCM output from NOR gate G3 goes to L level, and sense enable signal SE goes to H level.

Word line inactivating signal XCMh from this dummy sense amplifier DSAh is applied to word line drive circuits WDRk to WDRm provided for divided dummy column DDSETh. Therefore, with word line inactivating signal XCMH, the output signal from word line drive circuit WDRk goes to L level and the voltage level of the selected word line Wk is lowered to the ground voltage level. In the non-selected divided dummy column DDSET0, divided dummy bit lines DDT0 and DDB0 are not discharged and thus both at H level, and word line inactivating signal XCM0 remains at H level. However, all the corresponding row select signals X0 to Xj are in the non-selected state, and word lines W0 to Wj remain in the non-selected state.

When this selected word line Wk is driven to the non-selected state, the storage node of normal memory cell Mk0 is isolated from bit lines BT0 and BB0 and the potential of bit lines BT0 and BB0 stops being lowered.

Word line inactivating signals XCM0 to XCMh output from dummy sense amplifiers DSA0 to DSAH are only applied to the corresponding word line drive circuits. Therefore it is possible to set the loads on the signal lines respectively transmitting these word line inactivating signals XCM0 to XCMh to be 1/p as large as those in the configuration shown in FIG. 16. Here, p represents the number of the divided dummy columns. Thus, it is possible to reduce the charging/discharging current of word line inactivating signals XCM0 to XCMh. Therefore, the increase in power consumption can be suppressed even when the operation frequency becomes higher and the number of times of charging/discharging per unit time in word line inactivating signals XCM0 to XCMh is increased.

[Ninth Embodiment]

Figure 22:
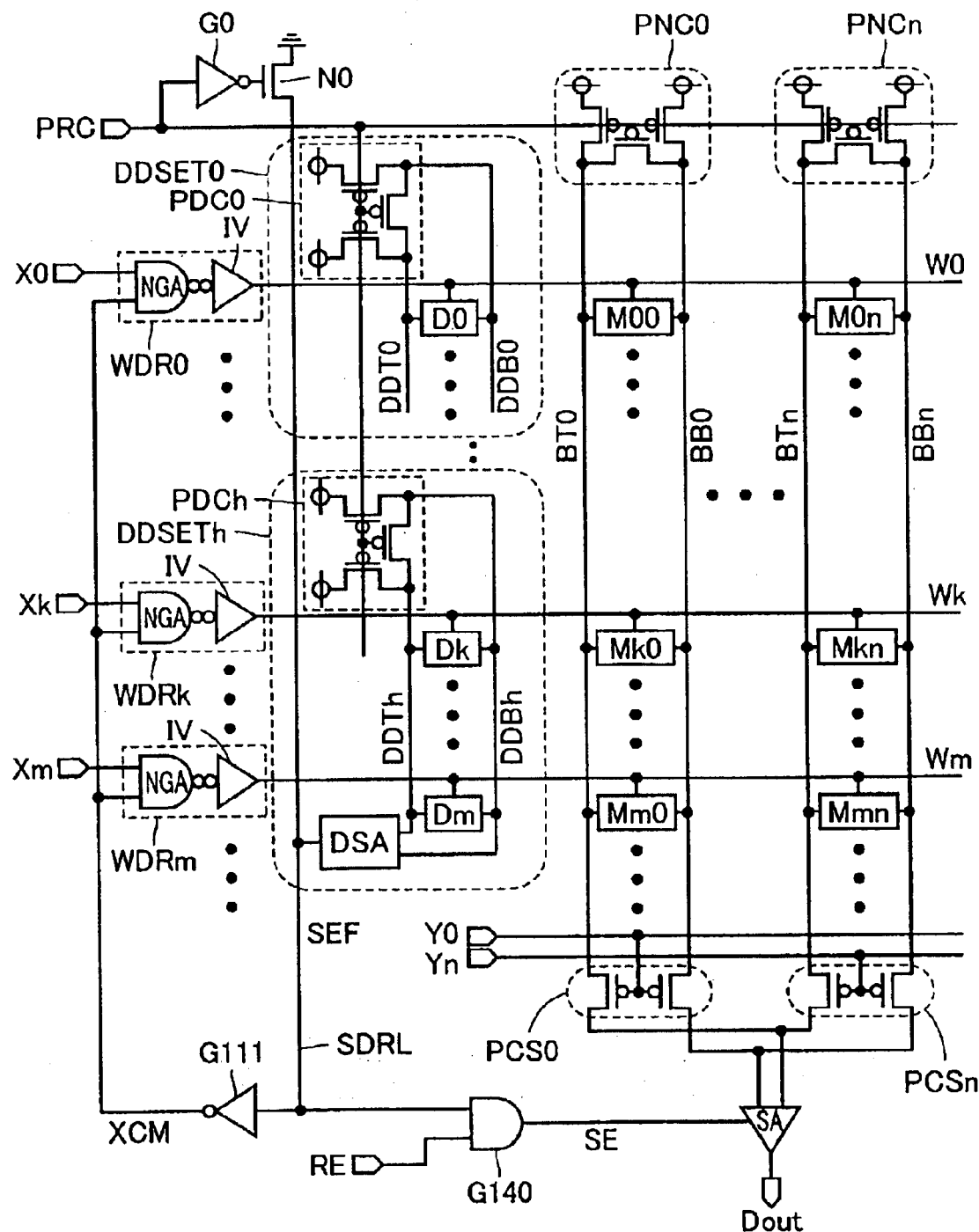
FIG. 22 is a diagram showing the configuration of the main part of SRAM in accordance with a ninth embodiment of the present invention.

FIG. 22 is a diagram showing the configuration of a main part of SRAM in accordance with a ninth embodiment of the present invention. This SRAM shown in FIG. 22 is different in configuration from SRAM shown in FIG. 16 in the following point. An AND gate G140 is provided, which receives sense enable fast signal SEF on sense control line SDRL and read enable signal RE to generate sense enable signal SE.

The other configuration of this SRAM shown in FIG. 22 is the same as the configuration of SRAM shown in FIG. 16. Therefore, the corresponding parts are denoted with the same reference numerals and the detailed description thereof will not be repeated.

Read enable signal RE is a signal generated in accordance with, for example, output enable signal OE externally supplied directly, or a signal generated by inverting write enable signal WE instructing a write operation. This read enable signal RE is activated in data reading operation mode. Therefore, sense amplifier SA is activated only in data reading operation mode and is held in an inactive state in data writing operation, thereby allowing reduction of power consumption.

Figure 23:
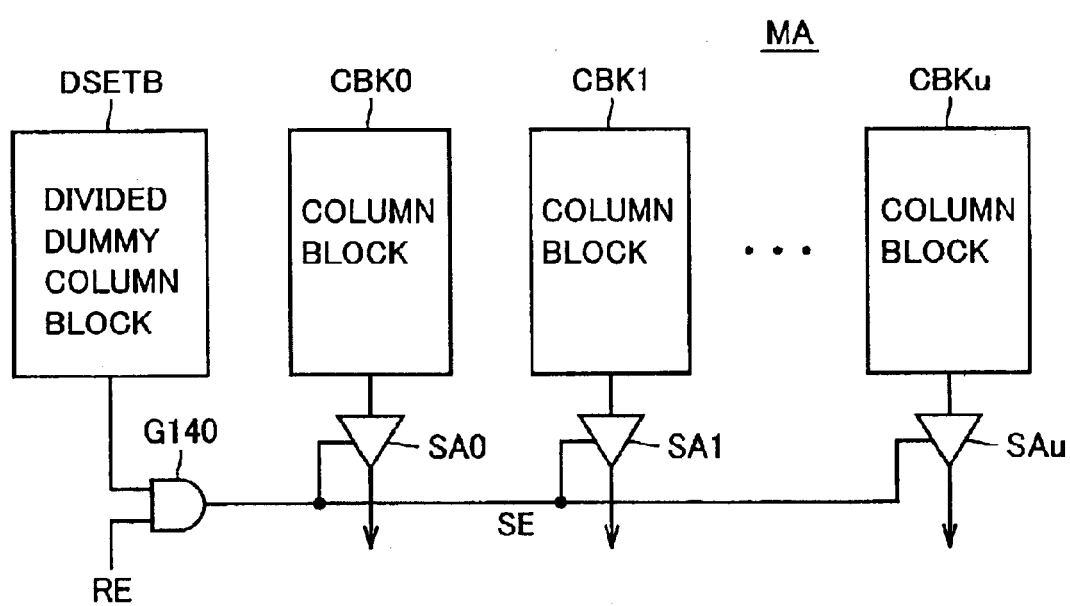
FIG. 23 is a diagram schematically showing the configuration of a memory array in SRAM in the ninth embodiment of the present invention.

FIG. 23 is a diagram schematically showing the configuration of the main part of SRAM. In FIG. 23, memory array MA is divided into a plurality of column blocks CBK0 to CBKu in the row extending direction. Each of these column blocks CBK0 to CBKu includes a prescribed number of normal bit line pairs. A divided dummy column block DSETB is provided in common to these column blocks CBK0 to CBKu. Divided dummy columns DDSET are arranged in this divided dummy column block DSETB, and divided dummy bit line pairs and a dummy sense amplifier are arranged in each divided dummy column DDSET. Word lines (not shown) are disposed in common to divided dummy column block DSETB and column blocks CBK0 to CBKu.

Sense amplifiers SA0 to SAu are arranged corresponding to column blocks CBK0 to CBKu, respectively. The sense enable signal SE from AND gate G140 is applied in common to these sense amplifiers SA0 to SAu.

Where the memory array MA has memory cells in, for example, 512 columns, column blocks CBK0 to CBKu each have memory cells arranged in eight columns. In the case of this configuration, there are sixty-four sense amplifiers SA0 to SAu. Therefore, a large parasitic capacitance exists on the signal line that transmits sense enable signal SE, relatively large current is consumed for charging/discharging sense enable signal SE.

This charging/discharging current of sense enable signal SE can be reduced by activating sense enable signal SE using AND gate 140 only during the reading operation cycle. Power consumption can be reduced by operating sense amplifiers SA0 to SAu only when necessary.

As described above, in accordance with the ninth embodiment of the present invention, sense enable signal SE is activated only in a read cycle in which data reading is performed, so that power consumption can be reduced.

It is noted that the internal read data output by sense amplifiers SA0 to SAu may be externally output in parallel through output buffers (not shown). Furthermore, the internal read data from sense amplifiers SA0 to SAu may be further selected in accordance with a column address signal for externally output as read data.

Furthermore, in place of SRAM shown in FIG. 22, such a configuration may be used in SRAM shown in FIG. 20, in which sense enable signal SE is activated only during a reading operation cycle.

In addition, dummy sense amplifier DSA may be set in an inactive state in a write operation cycle in accordance with a write instruction signal such as a write enable signal. In this case, the write operation instruction signal is applied in synchronization with precharge signal PRC.

[Tenth Embodiment]

Figure 24:
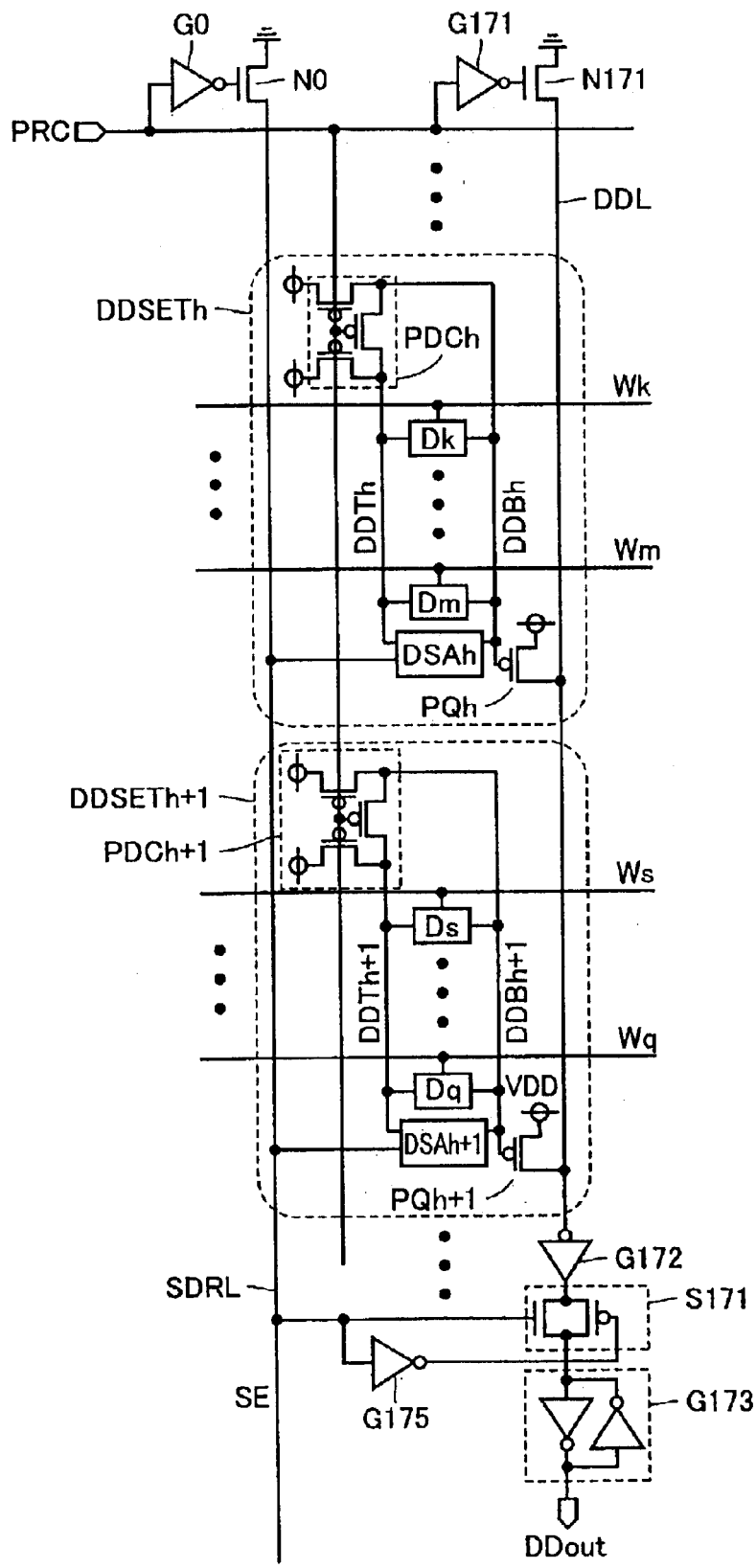
FIG. 24 is a diagram showing the configuration of a main part of SRAM in accordance with a tenth embodiment of the present invention.

FIG. 24 is a diagram showing the configuration of a main part of SRAM in accordance with a tenth embodiment of the present invention. In FIG. 24, the configuration of the divided dummy columns is shown. The configuration of the portion in which the normal bit lines are arranged is the same as the configuration in the preceding first to ninth embodiments. A dummy read data line DDL is arranged in common to the divided dummy columns. Dummy read data line DDL is precharged to the ground voltage level by N channel MOS transistor N171 responsive to an output signal from inverter G171 receiving precharge signal PRC.

Each of the divided dummy columns includes a P channel MOS transistor PQ driving dummy read data line DDL to the power supply voltage level in accordance with the voltage level of divided dummy bit line DDB. FIG. 24 representatively shows divided dummy columns DDSETh and DDSETh+1. Divided dummy column DDSETh includes a P channel MOS transistor PQh driving dummy read data line DDL to the power supply voltage level in accordance with the voltage on divided dummy bit line DDBh. Divided dummy column DDSETh+1 includes a P channel MOS transistor PQh+1 driving dummy read data line DDL to the power supply voltage level in accordance with the voltage level on divided dummy bit line DDBh+1.

The other configuration of divided dummy column DDSET (DDSETh, DDSETh+1) is the same as the configuration of the divided column shown in the first to ninth embodiments already described.

Dummy read data line DDL is further provided with an inverter C172 receiving the voltage on dummy read data line DDL, a CMOS transmission gate S171 rendered conductive in accordance with a complementary sense enable signal from inverter G175 and sense enable signal SE and passing the output signal from inverter G172 therethrough when conductive, and a latch circuit G173 latching a signal transmitted through CMOS transmission gate S171. Latch data DDout is externally output from latch circuit G173.

The operation of SRAM shown in FIG. 24 will now be described. Also in the configuration shown in FIG. 24, a reading operation is performed during H level of precharge signal PRC, and precharging is performed during L level of precharge signal PRC.

While precharge signal PRC is at L level, precharge circuits PDCh and PDCh+1 are activated, and all divided dummy bit lines DDT and DDB are precharged to the power supply voltage VDD level. MOS transistor N171 is conductive, dummy read data line DDL is discharged to the ground voltage level, and also sense drive line SDRL is initialized to the ground voltage level by MOS transistor N0. While sense enable signal SE is at L level, CMOS transmission gate G171 is in an off-state.

Figure 31:
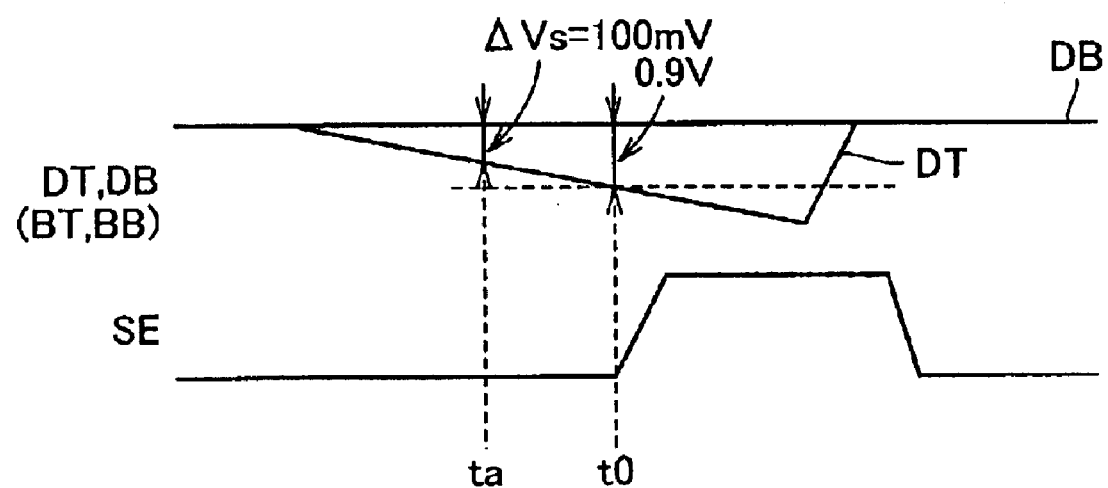
FIG. 31 is a signal waveform diagram representing the relation between a potential difference between a bit line pair and a sense amplifier enable signal in the conventional SRAM.

Concurrently with rising to H level of precharge signal PRC, a word line is selected and the voltage level of the selected word line rises to H level. Now, it is assumed that word line Ws is selected. In this state, assuming that H level data and L level data are stored respectively at storage nodes ML and MR (see FIG. 31) of dummy cell Ds, the potential of divided dummy bit line DDTh+1 remains at H level of the precharge voltage level while divided dummy bit line DDTh+1 connected to storage node MR has a current drawn out by dummy cell Ds and has its potential lowered.

When the potential of divided dummy bit line DDBh+1 is lowered beyond the threshold of dummy sense amplifier DSA, sense enable signal SE rises to H level. It is assumed that dummy sense amplifier DSA (DSAh+1) has the configuration shown in FIG. 4. In this case, when sense enable signal SE rises to H level, the voltage level of divided dummy bit line DDBh+1 is lowered to such an extent that P channel MOS transistor (P1) at the output stage of that dummy sense amplifier is turned on. Therefore, P channel MOS transistor PQh+1 having its gate connected to divided dummy bit line DDBh+1 is also turned on, and dummy read data line DDL is driven to H level.

When sense enable signal SE rises to H level, CMOS transmission gate S171 is rendered conductive, and data amplified by inverter G172 is transferred to latch circuit G173 and latched.

The timing at which sense enable signal SE rises to H level and the timing at which the potential of dummy read data line DDL falls are the same, since the dummy sense amplifier having the configuration shown in FIG. 4 is used. Therefore, it is ensured that when CMOS transmission gate S171 is rendered conductive, the stored data in the selected dummy cell Ds is read onto dummy read dummy line DDL.

Data latched into latch circuit G173 is externally output as output data DDout. By this latch circuit G173 latching the data read out from a dummy cell, the data from the dummy cell can be output externally at the same timing as that data amplified and latched by sense amplifier SA.

When L level data and H level data are stored respectively at storage nodes ML and MR (see FIG. 27) of dummy cell Ds, the potential of divided dummy bit line DDBh+1 connected to storage node MR remains at H level. Therefore, in this state, P channel MOS transistor PQh+1 is also held at an off-state, and dummy read data line DDL is held at the ground voltage level of the precharge level.

In this dummy cell D, fixed data may be stored in advance using a mask interconnection and others. Alternatively, in a case where the stored data in this dummy cell D (D0 to Dq) is made externally rewritable, for example, the following configuration can be used. A complementary dummy read data line ZDDL is disposed in parallel with dummy read data line DDL. In writing data, complementary data latched by latch circuit G173 is transferred to these complementary dummy read data lines DDL and ZDDL. Divided dummy bit lines DDT and DDB are connected to these complementary dummy read data lines DDL and ZDDL, for example, through transfer gate in writing data. In the connection of divided dummy bit lines DDT and DDB with dummy read data lines DDL and ZDDL, in accordance with a data write instruction signal (for example a write enable signal) combined with a block select signal specifying a selected word line, the divided dummy bit lines in the divided dummy column including the selected word line may be connected to complementary dummy read data lines DDL and ZDDL. Furthermore, in all divided dummy columns DDSET0 to DDESTh+1, divided dummy bit lines DDT and DDB may be connected to complementary dummy read data lines DDL and ZDDL concurrently in writing data. Concurrently with selection of a word line, the transfer gate for writing is rendered conductive, and dummy read data lines DDL and ZDDL are connected with divided dummy bit lines DDT and DDB, so that write data can be accurately written to the selected dummy cell.

In the configuration shown in FIG. 24, dummy read data line DDL is driven by a P channel MOS transistor. However, dummy read data line DDL may be driven by an N channel MOS transistor.

As described above, in accordance with the tenth embodiment of the present invention, the dummy cell is used for storing data and this dummy cell can be utilized as a normal memory cell storing data, so that normal memory cells can be reduced by the number of the dummy cells, leading to a reduced memory array area.

[Eleventh Embodiment]

Figure 25:
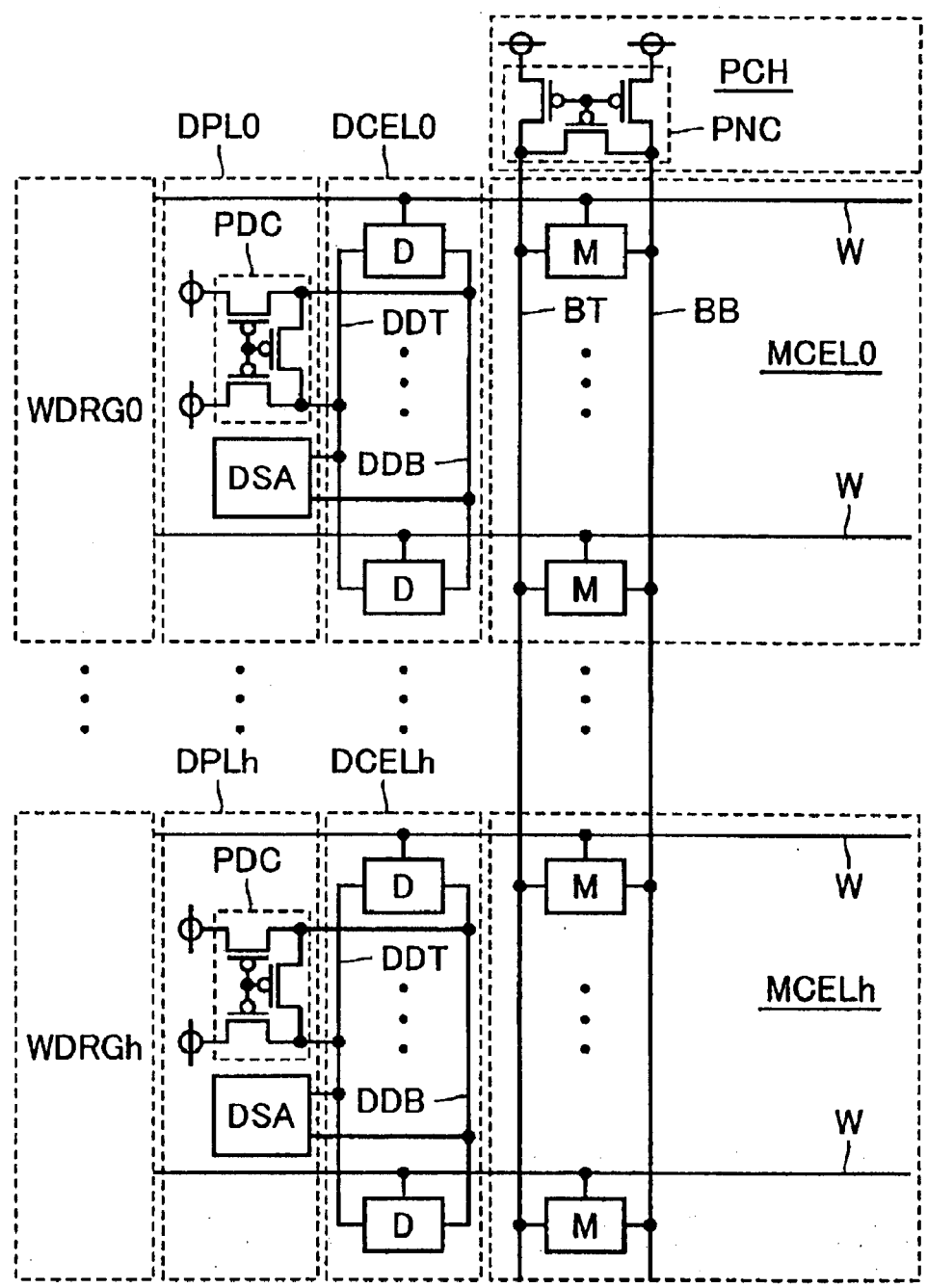
FIG. 25 is a diagram showing an arrangement of an array portion in SRAM in accordance with an eleventh embodiment of the present invention.
Figure 26:
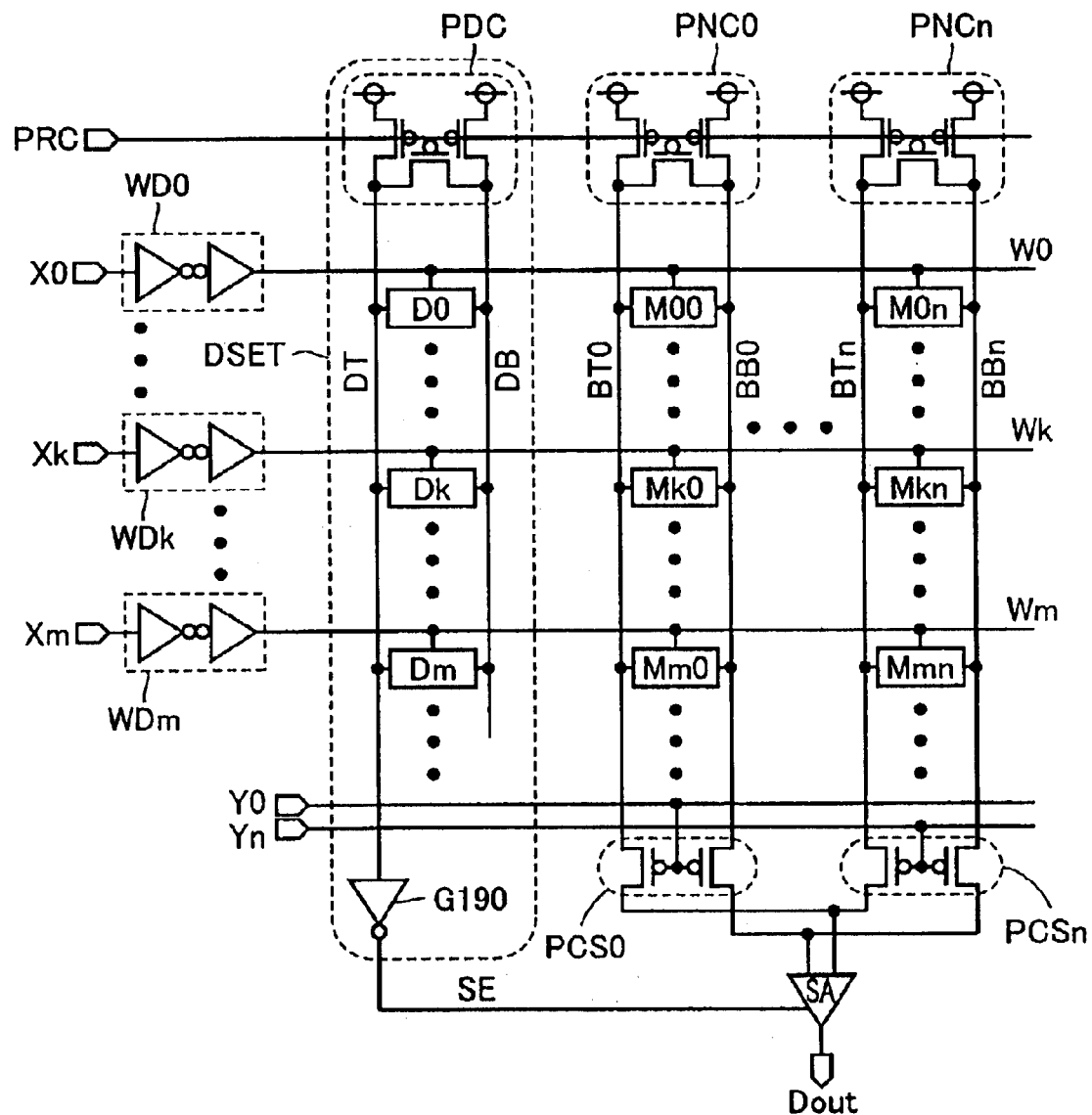
FIG. 26 is a diagram showing a configuration of a main part of a conventional SRAM.

FIG. 25 is a diagram schematically showing the arrangement of the array portion of SRAM in accordance with an eleventh embodiment of the present invention. In FIG. 25, a normal memory cell array, in which normal memory cells M are arranged, is divided into a plurality of normal cell arrangement regions MCEL0 to MCELh in the column extending direction. The normal bit lines BT and BB are arranged extending in the column direction in common to the normal cell arrangement regions MCEL0 to MCELh.

A precharge circuit arrangement region PCH, in which bit line precharge circuits PNC are arranged, is provided in alignment with normal cell arrangement regions MCEL0 to MCELh in the column extending direction.

Dummy cell arrangement regions DCEL0 to DCELh are disposed in alignment with normal cell arrangement regions MCEL0 to MCELh in the row extending direction. In each of these dummy cell arrangement regions DCEL0 to DCELh, divided dummy bit lines DDT and DDB are disposed.

Precharge/sense regions DPL0 to DPLh are arranged in alignment with dummy cell arrangement regions DCEL0 to DCELh in the row extending direction. In each of these precharge/sense arrangement regions DPL0 to DPLh, precharge circuit PDC for the divided dummy bit line and dummy sense amplifier DSA detecting the potential on the divided dummy bit line are arranged.

Adjacent to precharge/sense regions DPL0 to DPLh, word line drive circuit arrangement regions WDRG0 to WDRGh are arranged. In each of word line drive circuit arrangement regions WDRG0 to WDRGh, word line drive circuits (WDR) are arranged corresponding to word lines W.

As shown in FIG. 25, regions for arranging precharge circuits and dummy sense amplifier for the divide dummy bit lines are arranged in the regions aligned in the row extending direction with the regions DCEL0 to DCELh for arranging corresponding divided dummy bit lines. Thus, dummy cells D can be arranged at the same pitch as normal memory cells M. Therefore, in normal memory cell arrangement regions MCEL0 to MCELh, there is no empty space, so that normal memory cells M and divided dummy cells D can be arranged in high density.

As described above, in accordance with the eleventh embodiment of the present invention, the precharge circuits and sense amplifier circuits for the divided dummy bit lines are arranged outside the memory cell array. Thus, dummy cells D and normal memory cells M can be arranged at the same pitch. Consequently, no empty region exists in the memory array, and the divided dummy bit line configuration can be implemented with a minimum increase in area.

As described above, in accordance with the present invention, the divided dummy bit lines are arranged, a sense amplifier is activated in accordance with a potential change on any divided dummy bit line, the sense amplifier can be activated at a faster timing, and a high speed reading can be performed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of normal cells arranged in rows and columns;
   a plurality of dummy cells arranged, in at least one column, sharing the rows with the normal cells and divided into a plurality of blocks in a column extending direction;
   a plurality of normal bit lines, arranged corresponding to the columns of the normal cells, each having normal cells on a corresponding column connected;
   a plurality of divided dummy bit lines, arranged corresponding to the blocks of the column of said dummy cells, each having dummy cells in a corresponding block connected;

a sense amplifier for sensing and amplifying data in a selected cell of the normal cells; and a sense control circuit responsive to a potential change on either of said plurality of divided dummy bit lines, for activating said sense amplifier.

2. The semiconductor memory device according to claim 1, wherein the normal cells each and the dummy cells each are the same in circuit connection and in transistor size.

3. The semiconductor memory device according to claim 1, wherein said sense control circuit includes
a sense control line arranged commonly to said plurality of divided dummy bit lines for transmitting to said sense amplifier a sense enable signal activating said sense amplifier, and
a plurality of dummy sense circuits, arranged corresponding to the respective divided dummy bit lines, each for detecting a potential change on a corresponding divided dummy bit line and driving said sense control line in accordance with a result of detection.

4. The semiconductor memory device according to claim 3, wherein each normal bit line includes first and second bit lines transferring complementary data in selection of an associated memory cell,
each divided dummy bit line has first and second dummy bit lines transferring complementary data in selection of a dummy cell in a corresponding block,
each dummy sense circuit detects potential change on corresponding first and second dummy bit lines and drives said sense control line toward a voltage level activating said sense enable signal when a potential change occurs in either of the corresponding first and second dummy bit lines.

5. The semiconductor memory device according to claim 3, wherein each dummy sense circuit includes an insulated gate type field effect transistor selectively rendered conductive in accordance with a potential on a corresponding divided dummy bit line and driving said sense control line when conductive.

6. The semiconductor memory device according to claim 1, wherein said sense control circuit further includes a feedback circuit for detecting a potential change on the divided dummy bit lines and accelerating the potential change on a divided dummy bit line causing the potential change in accordance with a result of detection.

7. The semiconductor memory device according to claim 1, wherein said sense control circuit includes
a potential change detection circuit arranged corresponding to each divided dummy bit line and detecting a potential change on a corresponding divided dummy bit line,
an acceleration circuit responsive to detection of the potential change by said potential change detection circuit, for accelerating the potential change on the corresponding divided dummy bit line, and
a sense drive circuit responsive to detection of the potential change by said potential change detection circuit, for driving a sense control line transmitting a sense enable signal activating said sense amplifier.

8. The semiconductor memory device according to claim 1, wherein said sense control circuit includes
a sense drive circuit arranged corresponding to each divided dummy bit line, and responsive to a potential on a corresponding divided dummy bit line for driving a sense control line transmitting a sense enable signal activating said sense amplifier, and
a circuit responsive to an output signal of said sense drive circuit for accelerating the potential change on said corresponding divided dummy bit line.

9. The semiconductor memory device according to claim 1, wherein said sense control circuit includes
a first conductivity-type insulated gate field effect transistor arranged corresponding to each divided dummy bit line, and responsive to a potential on a corresponding divided dummy bit line for driving a corresponding internal node, and
a second conductivity-type insulated gate field effect transistor arranged corresponding to the first conductivity-type insulated gate field effect transistor for driving a sense control line transmitting a sense enable signal activating said sense amplifier, in accordance with a potential at said corresponding internal node.

10. The semiconductor memory device according to claim 1, further comprising a sense amplifier activating control circuit selectively activated in response to an activating control signal to generate a sense enable signal activating said sense amplifier in accordance with an external signal when activated, wherein said sense control circuit inactivated when said sense amplifier active control circuit is active, in response to said activating control signal.

11. The semiconductor memory device according to claim 1, further comprising a circuit responsive to activation of a sense amplifier activation signal activating said sense amplifier for driving a memory array including said normal cells and said dummy cells to an initial state.

12. The semiconductor memory device according to claim 1, further comprising:

a plurality of word lines, arranged corresponding to the respective rows of the normal and dummy cells, each connecting to a normal cell and a dummy cell on a corresponding row; and
a word line select circuit for driving, to a selected state, a word line arranged corresponding to an addressed row of said plurality of word lines in accordance with an address signal, said word line select circuit being inactivated in response to activation of a sense amplifier activation signal activating said sense amplifier, to drive a selected word line to a non-selected state.

13. The semiconductor memory device according to claim 12, wherein said sense control circuit includes a plurality of dummy sense circuits, arranged corresponding to the divided dummy bit lines, each for detecting a potential change on a corresponding dummy bit line to activate said sense amplifier activation signal, and
said word line select circuit includes a plurality of divided word line select circuits, arranged corresponding to the divided dummy bit lines, each responsive to an output signal of a corresponding dummy sense amplifier for setting, to a non-selected state, a word line arranged crossing a corresponding divided dummy bit line.

14. The semiconductor memory device according to claim 12, further comprising a precharge circuit responsive to activation of a sense amplifier activation signal activating said sense amplifier from said sense control circuit for precharging the normal bit lines and the divided dummy bit lines to a prescribed potential.

15. The semiconductor memory device according to claim 1, further comprising a read control circuit responsive to a data read operation instruction signal for supplying said sense amplifier with a sense amplifier activation signal activating said sense amplifier from said sense control circuit.

16. The semiconductor memory device according to claim 1, further comprising a read circuit arranged separately from said sense control circuit, for detecting a potential on the divided dummy bit line to generate an internal read data.

17. The semiconductor memory device according to claim 16, further comprising a latch circuit responsive to activation of a sense amplifier activation signal activating said sense amplifier from said sense control circuit for latching output data from said read circuit.

18. The semiconductor memory device according to claim 1, further comprising a plurality of divided dummy bit line precharge circuits, arranged in circuit regions corresponding to the respective divided dummy bit lines, each aligned with a region having a corresponding divided dummy bit line arranged in a row extending direction, for precharging the corresponding divided dummy bit line to a prescribed potential when activated.

19. The semiconductor memory device according to claim 18, wherein said sense control circuit includes a plurality of dummy sense circuits each arranged in the circuit region, and each detecting a potential change on a corresponding divided dummy bit line to drive a sense amplifier activation signal for activating said sense amplifier.

20. The semiconductor memory device according to claim 1, wherein said sense control circuit includes a plurality of dummy sense circuits, arranged in circuit regions corresponding to the respective divided dummy bit lines and aligned with regions having corresponding divided dummy bit lines arranged in a row extending direction, each for detecting a potential change on the corresponding dummy bit line to drive a sense amplifier activation signal activating said sense amplifier.

* * * * *